US012765195B2

(12) United States Patent
Nam et al.

(10) Patent No.: US 12,765,195 B2

(45) Date of Patent: Oct. 13, 2026

(54) DISPLAY APPARATUS

(71) Applicant: Samsung Display Co., Ltd., Yongin-Si (KR)

(72) Inventors: Yunyong Nam, Yongin-si (KR); Soyoung Koo, Yongin-si (KR); Eoksu Kim, Yongin-si (KR); Hyungjun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 18/429,437

(22) Filed: Feb. 1, 2024

(65) Prior Publication Data

US 2024/0324339 A1 Sep. 26, 2024

(30) Foreign Application Priority Data

Mar. 24, 2023 (KR) ........................ 10-2023-0039072
Apr. 7, 2023 (KR) ........................ 10-2023-0046199

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0842* (2013.01)

(58) Field of Classification Search
CPC ............... H10K 59/131; G09G 3/3233; G09G 2300/0426; G09G 2300/0842
See application file for complete search history.

(56) References Cited

U.S. PATENT DOCUMENTS

| | | | |
|---|---|---|---|
| 7,550,764 B2 | 6/2009 | Jang et al. | |
| 9,443,886 B2 | 9/2016 | Oh et al. | |
| 10,629,125 B2 | 4/2020 | Kim et al. | |
| 2021/0055615 A1* | 2/2021 | Cheng | G02F 1/13456 |
| 2025/0043244 A1* | 2/2025 | Maloney | C12Y 304/21079 |

FOREIGN PATENT DOCUMENTS

| | | |
|---|---|---|
| KR | 10-2005-0050240 A | 5/2005 |
| KR | 10-0553935 B1 | 2/2006 |
| KR | 10-2019-0002934 A | 1/2019 |
| KR | 10-2241442 B1 | 4/2021 |

* cited by examiner

*Primary Examiner* — Karen Kusumakar

(74) *Attorney, Agent, or Firm* — Innovation Counsel LLP

(57) ABSTRACT

A display apparatus includes a substrate including a display area, in which a plurality of pixels are arranged, and a peripheral area outside the display area, a data line arranged in the display area and extending in a first direction, a first semiconductor pattern disposed on the data line and extending in a second direction crossing the first direction, a gate line disposed on the first semiconductor pattern and extending in the first direction to cross the first semiconductor pattern, and an anchor located at an end portion of the gate line and having a width greater than a width of the gate line.

22 Claims, 23 Drawing Sheets

DISPLAY APPARATUS

CROSS-REFERENCE TO RELATED APPLICATION

This application is based on and claims priority, under 35 U.S.C. § 119, to Korean Patent Application No. 10-2023-0039072 filed on Mar. 24, 2023 in the Korean Intellectual Property Office, and Korean Patent Application No. 10-2023-0046199 filed on Apr. 7, 2023 in the Korean Intellectual Property Office, the disclosures of which are incorporated by reference herein in their entireties.

BACKGROUND

1. Field

One or more embodiments relate to a display apparatus.

2. Description of the Related Art

Recently, display apparatuses are used for various purposes. Furthermore, as the thickness and weight of a display apparatus have been decreased, the range of use thereof has become broader.

In the display apparatus, thin film transistors, capacitors, and wires to control the luminance of each pixel may be arranged in each pixel. As display apparatuses have many different applications, various forms of display apparatuses have been designed.

SUMMARY

The present disclosure pertains to a display apparatus capable of displaying high-quality images. The embodiments presented in the disclosure are just examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area outside the display area, wherein a plurality of pixels are arranged in the display area, a data line arranged in the display area and extending in a first direction, a first semiconductor pattern disposed on the data line and extending in a second direction crossing the first direction, a gate line disposed on the first semiconductor pattern and extending in the first direction to cross the first semiconductor pattern, and an anchor located at an end portion of the gate line and having a width greater than a width of the gate line.

In an embodiment, the anchor may be integrally provided with the gate line.

In an embodiment, the gate line may include a first metal layer and a second metal layer sequentially stacked on each other, the anchor may include a fourth metal layer, a fifth metal layer, and a sixth metal layer sequentially stacked on each other, an upper surface of the second metal layer may have a first width in the second direction, an upper surface of the fifth metal layer may have a second width in the second direction, and the second width may be greater than the first width.

In an embodiment, the gate line may further include a third metal layer disposed on the second metal layer, the third metal layer may have a third width in the second direction, and the third width may be less than the first width.

In an embodiment, the sixth metal layer may have a fifth width in the second direction, and the fifth width may be greater than the third width.

In an embodiment, the display apparatus may further include a first insulating layer disposed on the gate line, and the first insulating layer may be in direct contact with the upper surface of the second metal layer.

In an embodiment, the display apparatus may further include a first insulating pattern arranged between the first semiconductor pattern and the gate line, the first insulating pattern may have a fourth width in the second direction, and the fourth width may be greater than the first width.

In an embodiment, the first insulating pattern may have a shape matching a shape of the gate line.

In an embodiment, the first insulating pattern may include a shoulder portion extending beyond an edge of the gate line.

According to one or more embodiments, a display apparatus includes a first data line and a second data line disposed apart from each other on a substrate and extending in a first direction, a first-1 semiconductor pattern electrically connected to the first data line and extending in a second direction crossing the first direction, a first-2 semiconductor pattern electrically connected to the second data line and extending in the second direction, a first gate line extending in the first direction to cross the first-1 semiconductor pattern, a second gate line extending in the first direction to cross the first-2 semiconductor pattern, a first anchor arranged between the first gate line and the second gate line, extending in the first direction, and having a width greater than a width of the first gate line and a width of the second gate line, and a second anchor located at an end portion of the second gate line and having a width greater than the width of the first gate line and the width of the second gate line.

In an embodiment, the first gate line, the first anchor, the second gate line, and the second anchor may be integrally provided.

In an embodiment, the first gate line, the first anchor, the second gate line, and the second anchor may share an extension axis.

In an embodiment, the first gate line and the second gate line may each include a first metal layer and a second metal layer sequentially stacked on each other, the first anchor and the second anchor may each include a fourth metal layer, a fifth metal layer, and a sixth metal layer sequentially stacked on each other, an upper surface of the second metal layer may have a first width in the second direction, an upper surface of the fifth metal layer may have a second width in the second direction, and the second width may be greater than the first width.

In an embodiment, the first gate line and the second gate line each may further include a third metal layer disposed on the second metal layer, the third metal layer may have a third width in the second direction, and the third width may be less than the first width.

In an embodiment, the display apparatus may further include a first-1 insulating pattern arranged between the first gate line and the first-1 semiconductor pattern, and a first-2 insulating pattern arranged between the second gate line and the first-2 semiconductor pattern, wherein the first-1 insulating pattern and the first-2 insulating pattern each may have a fourth width in the second direction, and the fourth width may be greater than the first width.

In an embodiment, the first-1 insulating pattern may have a shape that matches a shape of the first gate line and may include a shoulder portion extending beyond an edge of the first gate line, and the first-2 insulating pattern may have a shape that matches a shape of the second gate line and may include a shoulder portion extending beyond an edge of the second gate line.

According to one or more embodiments, a display apparatus includes a substrate including a display area and a peripheral area outside the display area, wherein a plurality of pixels are arranged in the display area, a third semiconductor pattern arranged in the peripheral area, a driving gate line disposed on the third semiconductor pattern and including a body wire extending in a first direction and a plurality of branch wires extending from the body wire in a second direction crossing the first direction and an anchor located at an end portion of at least one of the plurality of branch wires, and having a width greater than a width of a corresponding one of the plurality of branch wire.

In an embodiment, the anchor may be integrally provided with the corresponding one of the plurality of branch wires.

In an embodiment, the plurality of branch wires may each include a first metal layer and a second metal layer sequentially stacked on each other, the anchor may include a fourth metal layer, a fifth metal layer, and a sixth metal layer sequentially stacked on each other, an upper surface of the second metal layer may have a seventh width in the first direction, an upper surface of the fifth metal layer may have an eighth width in the first direction, and the eighth width may be greater than the seventh width.

In an embodiment, at least one of the plurality of branch wires may be connected to a bridge wire extending in the first direction, and a width of the bridge wire in the second direction may be greater than widths of the some branch wires in the first direction.

In an embodiment, the bridge wire may be integrally provided with the at least one of the plurality of branch wires.

In an embodiment, the display apparatus may further include a third insulating pattern arranged between the third semiconductor pattern and the driving gate line, and the third insulating pattern may have a shape that matches a shape of the driving gate line and include a shoulder portion extending beyond an edge of the driving gate line.

Other aspects, features, and advantages than those described above will become apparent from the following drawings, claims, and detailed description of the disclosure

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
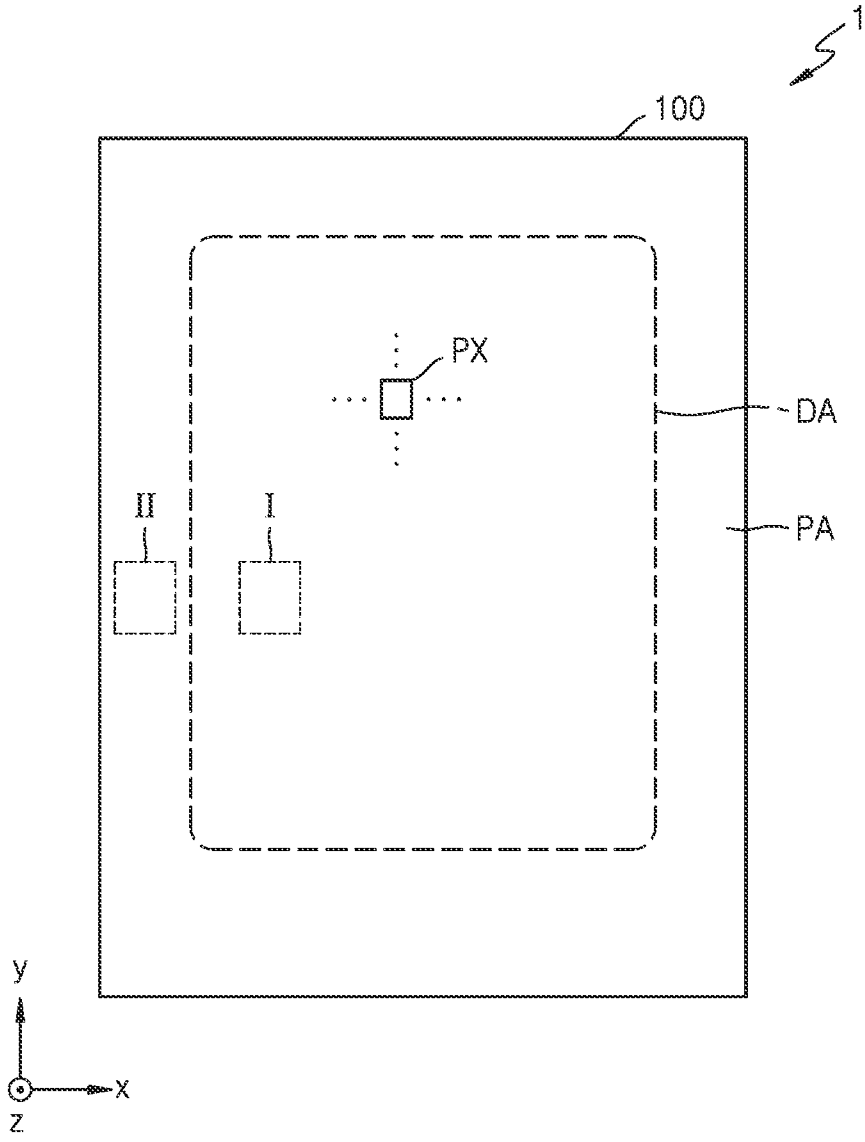
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates the following possibilities: only a, only b, only c, both a and b, both a and c, both b and c, and all of a, b, and c.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, exemplary embodiments will be described in detail with reference to the accompanying drawings, and in the description with reference to the drawings, the same or corresponding constituents are indicated by the same reference numerals and redundant descriptions thereof are omitted.

As used herein, it will be understood that although the terms first, second, etc. may be used herein to describe various elements, these elements should not be limited by these terms. These elements are only used to distinguish one element from another.

As used herein, as used herein, the singular forms "a," "an," and "the" are intended to include the plural forms as well, unless the context clearly indicates otherwise.

As used herein, it will be further understood that the terms "comprises" and/or "comprising" used herein specify the presence of stated features or elements, but do not preclude the presence or addition of one or more other features or components.

As used herein, it will be understood that when an element, such as a layer, a film, a region, or a plate, is referred to as being "on" another element, the element can be directly on the other element or intervening elements may be present thereon.

As used herein, it will be understood that when a layer, region, or element is referred to as being "connected to" another layer, region, or element, it can be directly connected to the other layer, region, or component or indirectly connected to the other layer, region, or component via intervening layers, regions, or components. For example, as used herein, when a layer, region, or component is referred to as being electrically connected to another layer, region, or component, it can be directly electrically connected to the other layer, region, or component or indirectly electrically connected to the other layer, region, or component via intervening layers, regions, or components.

As used herein, the expression such as "A and/or B" may include A, B, or A and B.

As used herein, the x-direction, the y-direction, and the z-direction are not limited to three axes of the rectangular coordinate system, and may be interpreted in a broader sense. For example, the x-direction, the y-direction, and the z-direction may be perpendicular to one another, or may represent different directions that are not perpendicular to one another.

As used herein, the terms "about" or "approximately" include any numerical values recited herein, and may indicate an acceptable range of deviations determined by considering the error associated with a manufacturing method or a measurement method for the value recited herein. For example, as used herein, the term "about" may mean within ±20%, ±10% or ±5% of the stated value.

As used herein, when a certain embodiment may be implemented differently, a specific process order may be performed differently from the described order. For example, two consecutively described processes may be performed substantially at the same time or performed in an order opposite to the described order.

Magnitudes of elements in the drawings may be exaggerated for convenience of explanation. For example, since magnitudes and thicknesses of elements in the drawings are arbitrarily illustrated for convenience of explanation, the following embodiments are not limited thereto.

FIG. 1 is a schematic plan view of a display apparatus 1 according to an embodiment.

Referring to FIG. 1, the display apparatus 1 may include a display area DA for implementing an image and a peripheral area PA arranged outside the display area DA. As the display apparatus 1 includes a substrate 100, it may be said that the substrate 100 includes the display area DA and the peripheral area PA.

The substrate 100 may include a glass material, a ceramic material, or a metal material. The substrate 100 may include a flexible or bendable material. When the substrate 100 is flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single layer or multilayer structure including the material described above, and may further include an inorganic layer in the case of a multilayer structure.

FIG. 1 illustrates that the display area DA has a rectangular shape in which the width in a first direction (e.g., a y direction) is greater than the width in a second direction (e.g., an x direction). However, the disclosure is not limited thereto. The display area DA may have various shapes, for example, a circular shape, an oval shape, a polygonal shape, the shape of a specific figure, and the like.

A plurality of pixels PX may be arranged in the display area DA of the substrate 100. The pixels PX are arranged in various forms, such as a stripe array, a Pentile® array, a mosaic array, and the like, to implement an image. Each of the pixels PX may include a pixel circuit including thin film transistors and a capacitor and a display element, such as an organic light-emitting diode OLED (see FIG. 3A or FIG. 3B) and the like, electrically connected to the pixel circuit. Each pixel PX may emit, for example, red, green, or blue light.

The peripheral area PA may be a kind of a non-display area in which the pixels PX are not arranged. Various wires for transmitting electrical signals to the display area DA, a scan drive circuit, an emission control drive circuit, pads, and the like may be located in the peripheral area PA.

The display apparatus 1 according to an embodiment, which includes a display panel, may include various apparatuses, such as a smartphone, a tablet, a laptop, a television, a billboard, or the like.

In the following description, although an organic light-emitting display apparatus is described as an example of the display apparatus 1 according to an embodiment, the display apparatus according to one or more embodiments is not limited thereto. In another embodiment, the display apparatus according to one or more embodiments may include an inorganic light-emitting display apparatus (or an inorganic electroluminescent (EL) display apparatus), a quantum-dot light-emitting display apparatus, and the like. For example, an emission layer of the display element in the display apparatus 1 according to an embodiment may include an organic material or an inorganic material. Furthermore, the display apparatus 1 according to an embodiment may include an emission layer and quantum dots located on a path of light emitted from the emission layer.

Figure 2:
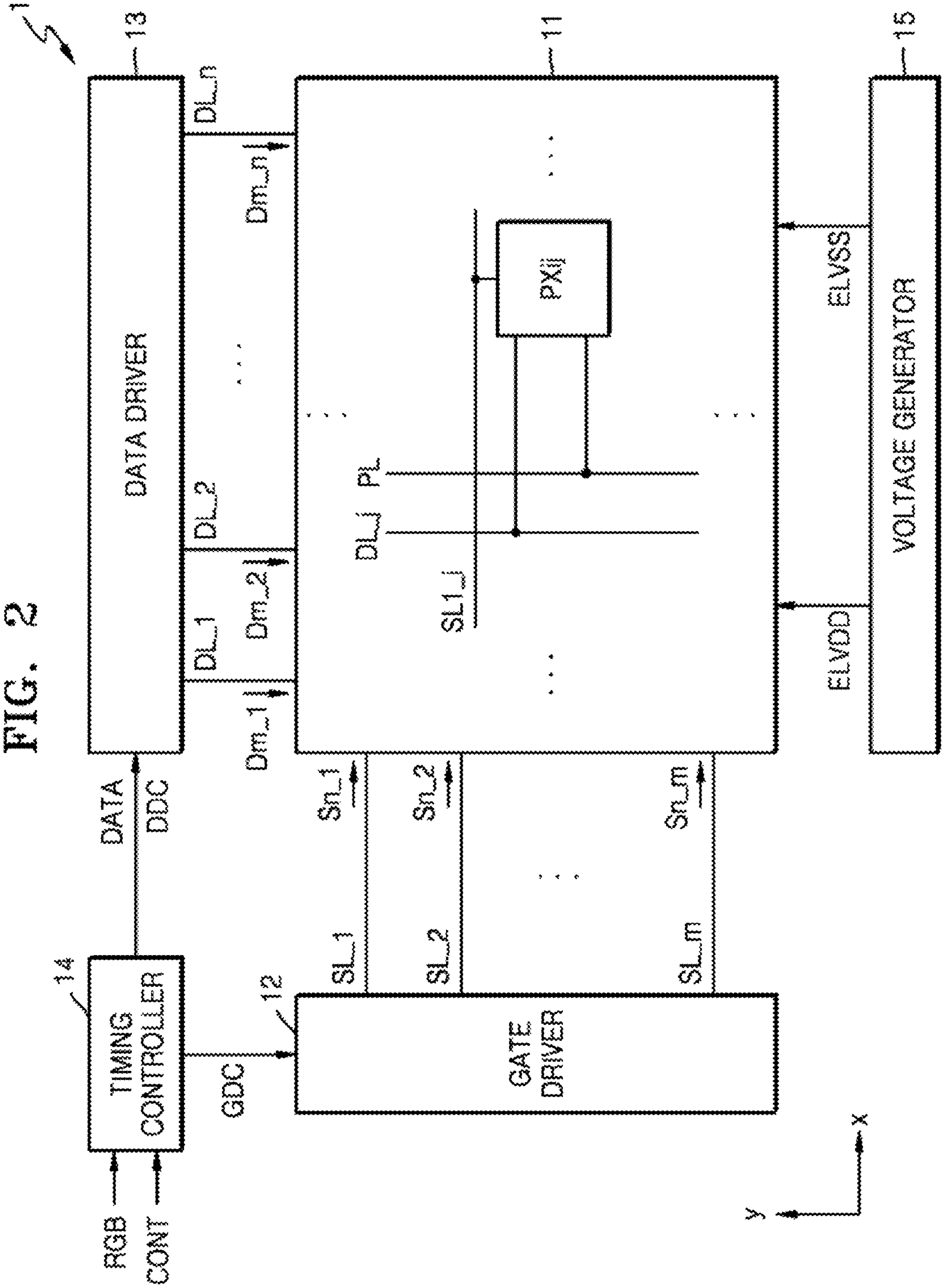
FIG. 2 is a schematic block diagram of a display apparatus according to an embodiment.

FIG. 2 is a schematic block diagram of the display apparatus 1 according to an embodiment.

Referring to FIG. 2, the display apparatus 1 may include a display portion 11, a gate driver 12, a data driver 13, a timing controller 14, and a voltage generator 15. The display portion 11 is arranged in the display area DA of FIG. 1 described above, and the gate driver 12, the data driver 13, the timing controller 14, and the voltage generator 15 are arranged in the peripheral area PA of FIG. 1.

The display portion 11 may include the pixels PX, such as a pixel PXij located at the i-th row and the j-th column. Although FIG. 2 illustrates only one pixel PXij, the display portion 11 may include, for example, (m×n) pixels PX arranged in the form of a matrix. i denotes a natural number between 1 and m, including 1 and m, and j denotes a natural number between 1 and n, including 1 and n.

Figure 3A:
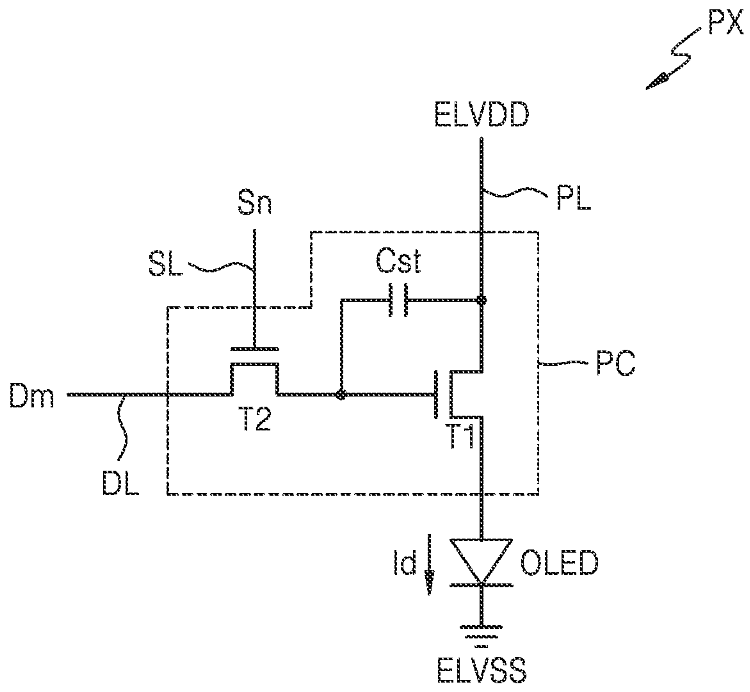
FIGS. 3A and 3B are schematic equivalent circuit diagrams of one pixel in a display apparatus according to example embodiments.

In FIG. 3A, a pixel PX including two transistors and one capacitor is mainly described. However, the disclosure is not applied to only the pixel PX employing a specific pixel circuit, but may be identically applied to the pixel PX employing other pixel circuits, for example, a pixel PX employing a pixel circuit including three transistors and one capacitor, a pixel PX employing a pixel circuit including seven transistors and one capacitor.

The pixels PX are connected to scan lines SL_1 to SL_m, data lines DL_1 to DL_n, and a power line PL. For example, as illustrated in FIG. 2, the pixel PXij located at the i-th row and the j-th column may be connected to a scan line SL_i, a data line DL_j, and the power line PL.

The data lines DL_1 to DL_n may extend in a first direction ( e.g., the y direction or a column direction) and may be connected to the pixels PX located in the same column. The scan lines SL_1 to SL_m may extend in a second direction (e.g., the x direction or a row direction) and may be connected to the pixels PX located in the same row.

The power line PL my include a plurality of vertical power lines extending in the first direction (e.g., the y direction), and the vertical power lines may be connected to the pixels PX located in the same column. The power line PL may include a plurality of horizontal power lines extending in the second direction (e.g., the x direction), and the horizontal power lines may be connected to the pixels PX located in the same row. The horizontal power lines and the vertical power lines may be connected to each other.

The scan lines SL_1 to SL_m are configured to respectively transmit scan signals Sn_1 to Sn_m output from the gate driver 12 to the pixels PX in the same row. The data lines DL_1 to DL_n are configured to respectively transmit data voltages Dm_1 to Dm_n output from the data driver 13 to the pixels PX in the same column. The pixel PXij located at the i-th row and the j-th column receives a scan signal Sn_i and a data voltage Dm_j.

The power line PL is configured to transmit a first driving voltage ELVDD output from the voltage generator 15 to the pixels PX.

The pixel PXij may include a display element and a driving transistor for controlling the magnitude of a current flowing in the display element based on the data voltage Dm_j. The data voltage Dm_j is output from the data driver 13 and received by the pixel PXij through the data line DL_j. The display element may include, for example, an organic light-emitting diode. As the display element emits light having a brightness corresponding to the magnitude of the current received from the driving transistor, the pixel PXij may represent a gradation corresponding to the data voltage Dm_j. As used herein, the pixels PX may include a portion, for example, a sub-pixel, of a unit pixel that represents a full color. The pixel PXij may further include at least one switching transistor and at least one capacitor. The pixel PXij will be described below in detail.

The voltage generator 15 may generate voltages needed for driving the pixel PXij. For example, the voltage generator 15 may generate the first driving voltage ELVDD and a second driving voltage ELVSS. The level of the first driving voltage ELVDD may be higher than the level of the second driving voltage ELVSS.

Although not illustrated in FIG. 2, the voltage generator 15 may generate a first gate voltage and a second gate voltage to control the switching transistor of the pixel PXij and provide the generated first and second gate voltages to the gate driver 12. When the first gate voltage is applied to a gate of the switching transistor, the switching transistor may be turned on, and when the second gate voltage is applied to a gate of the switching transistor, the switching transistor may be turned off. The switching transistor of the pixel PXijs may include an n-type MOSFET, and the level of the first gate voltage may be higher than the level of the second gate voltage.

The timing controller 14 may control the display portion 11 by controlling the operation timing of the gate driver 12 and the data driver 13. The pixels PX of the display portion 11 may receive a new data voltage Dm (see FIG. 3A or FIG. 3B) for each frame period, and emit light with a luminance corresponding to the data voltage Dm, thereby displaying an image corresponding to the image source data RGB of one frame.

The timing controller 14 receives the image source data RGB and a control signal CONT from the outside. The timing controller 14 may convert the image source data RGB into image data DATA based on the properties of the display portion 11 and the pixels PX, and the like. The timing controller 14 may provide the image data DATA to the data driver 13.

The control signal CONT may include a vertical synchronous signal, a horizontal synchronous signal, a data enable signal, a clock signal, and the like. The timing controller 14 may control the operation timing of the gate driver 12 and the data driver 13 by using the control signal CONT. The image source data RGB may include luminance information of the pixels PX. The luminance may have a gray of a predetermined number, for example, 1024 (=210), 256 (=28), or 64 (=26).

The timing controller 14 may generate control signals including a gate timing control signal GDC to control the operation timing of the gate driver 12, and a data timing control signal DDC to control the operation timing of the data driver 13.

The gate timing control signal GDC may include a gate start pulse signal, a gate shift clock signal, a gate output enable signal, and the like.

The data timing control signal DDC may include a source start pulse signal, a source sampling clock signal, a source output enable signal, and the like.

The gate driver 12 sequentially generates the scan signals Sn_1 to Sn_m in response to the gate timing control signal GDC provided by the timing controller 14, by using the first and second gate voltages provided by the voltage generator 15. The gate driver 12 may include a plurality of transistors and may be formed with the pixels PX through a thin film process. For example, the gate driver 12 may be mounted in the form of an oxide semiconductor TFT gate driver circuit (OSG) in the peripheral area PA.

The data driver 13 samples and latches the image data DATA provided by the timing controller 14, in response to the data timing control signal DDC provided by the timing controller 14, and converts the image data DATA into data of a parallel data scheme. The data driver 13, when converting the image data DATA into data of a parallel data scheme, converts the image data DATA into a gamma reference voltage that is an analog type data voltage. The data driver 13 provides the data voltages Dm_1 to Dm_n to the pixels PX through the data lines DL_1 to DL_n. The pixels PX receive the data voltages Dm_1 to Dm_n in response to the scan signals Sn_1 to Sn_m, respectively.

Figure 3B:
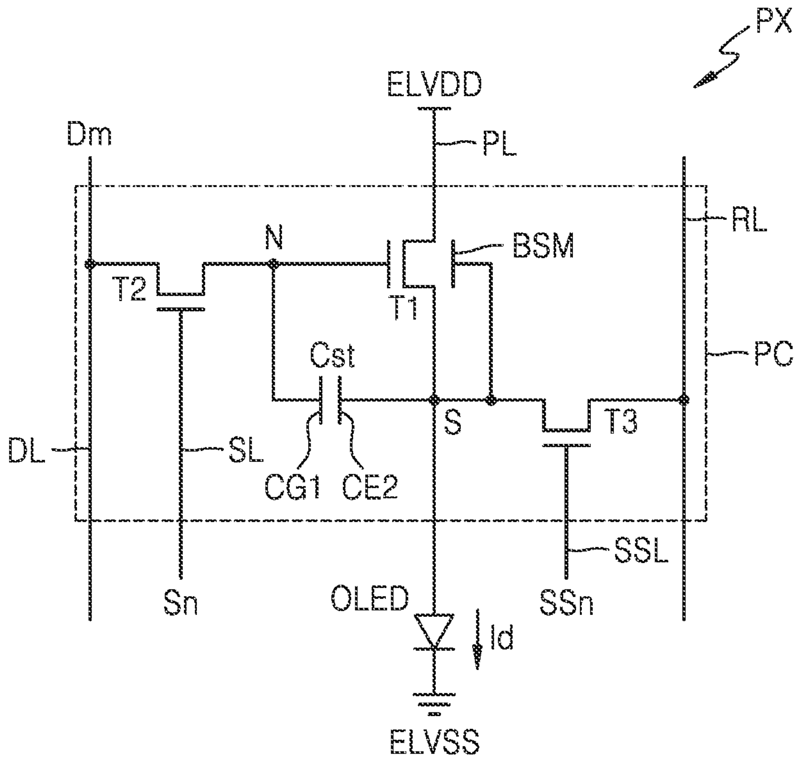

FIGS. 3A and 3B are schematic equivalent circuit diagrams of one pixel in the display apparatus 1 according to example embodiments.

Referring to FIG. 3A, one of the pixels PX may include a pixel circuit PC connected to a scan line SL and a data line DL, and a display element connected to the pixel circuit PC. The display element may include an organic light-emitting diode OLED including a pixel electrode (e.g., an anode) and a counter electrode (e.g., a cathode). The counter electrode of the organic light-emitting diode OLED may be a common electrode to which the second driving voltage ELVSS is applied.

The pixel circuit PC may include a first transistor T1, a second transistor T2, and a storage capacitor Cst.

The first transistor T1 may be a driving transistor in which the magnitude of a drain current is determined according to a gate-source voltage, and the second transistor T2 may be a switching transistor that is turned on/off according to a gate-source voltage, or a gate voltage. The first transistor T1 and the second transistor T2 may be formed as thin film transistors.

The storage capacitor Cst may be connected between the power line PL and the gate of the first transistor T1. The storage capacitor Cst may have a second electrode connected to the power line PL, and a first electrode connected to the gate of the first transistor T1. The storage capacitor Cst may store a voltage corresponding to a difference between a voltage received from the second transistor T2 and the first driving voltage ELVDD supplied through the power line PL.

The first transistor T1 may control the magnitude of a driving current Id flowing from the power line PL to the organic light-emitting diode OLED according to the gate-source voltage. The organic light-emitting diode OLED may emit light having a certain luminance by the driving current Id. The first transistor T1 may have a gate connected to the first electrode of the storage capacitor Cst, a drain connected to the power line PL, and a source connected to the organic light-emitting diode OLED.

The second transistor T2 may transmit the data voltage Dm to the gate of the first transistor T1 in response to a scan signal Sn. The second transistor T2 may have a gate connected to the scan line SL, a drain connected to the data line DL, and a source connected to the gate of the first transistor T1.

Referring to FIG. 3B, the pixel circuit PC may include the first transistor T1, the second transistor T2, a third transistor T3, and the storage capacitor Cst.

The first transistor T1 may be a driving transistor in which the magnitude of a drain current is determined according to a gate-source voltage, and the second transistor T2 and the third transistor T3 may be switching transistors that are turned on/off according to a gate-source voltage, substantially a gate voltage. The first transistor T1, the second transistor T2, and the third transistor T3 may be formed as thin film transistors.

The storage capacitor Cst may be connected between a first node N and a second node S. The storage capacitor Cst may have a first electrode CG1 connected to the first node N and a second electrode CE2 connected to the second node S. The storage capacitor Cst may store a voltage corresponding to a difference between the voltages supplied to the first node N and the second node S.

The first transistor T1 may control the magnitude of the driving current Id flowing from the power line PL to the organic light-emitting diode OLED according to the gate-source voltage. The organic light-emitting diode OLED may emit light having a certain luminance by the driving current Id. The first transistor T1 may have a gate connected to the first node N, a drain connected to the power line PL, and a source connected to the organic light-emitting diode OLED.

The second transistor T2 may transmit the data voltage Dm to the first node N in response to the scan signal Sn. The second transistor T2 may have a gate connected to the scan line SL, a drain connected to the data line DL, and a source connected to the first node N.

The third transistor T3 may serve to sense the electric potential of the pixel electrode of the organic light-emitting diode OLED. The third transistor T3 may have a gate connected to a sensing control line SSL, a drain connected to the second node S, and a source connected to a reference power line RL. The third transistor T3 may supply, in response to a sensing signal SSn of the sensing control line SSL, a pre-charging voltage from the reference power line RL to second node S, or a voltage of the pixel electrode of the organic light-emitting diode OLED to the reference power line RL during a sensing period.

A bias electrode BSM may be formed below the first transistor T1, and connected to the drain of the third transistor T3. As the bias electrode BSM is in association with the electric potential of the drain of the third transistor T3, the first transistor T1 may be stabilized. In an embodiment, the bias electrode BSM may not be connected to the third transistor T3, and may be connected to a separate bias wire (not shown).

Although FIG. 3A illustrates a case in which the pixel circuit PC includes two transistors and one storage capacitor and FIG. 3B illustrates a case in which the pixel circuit PC includes three transistors and one storage capacitor, the disclosure is not limited thereto. For example, the pixel circuit PC may include three or more transistors and/or two or more capacitors. In an embodiment, the pixel circuit PC may include seven transistors and one storage capacitor.

Figure 4:
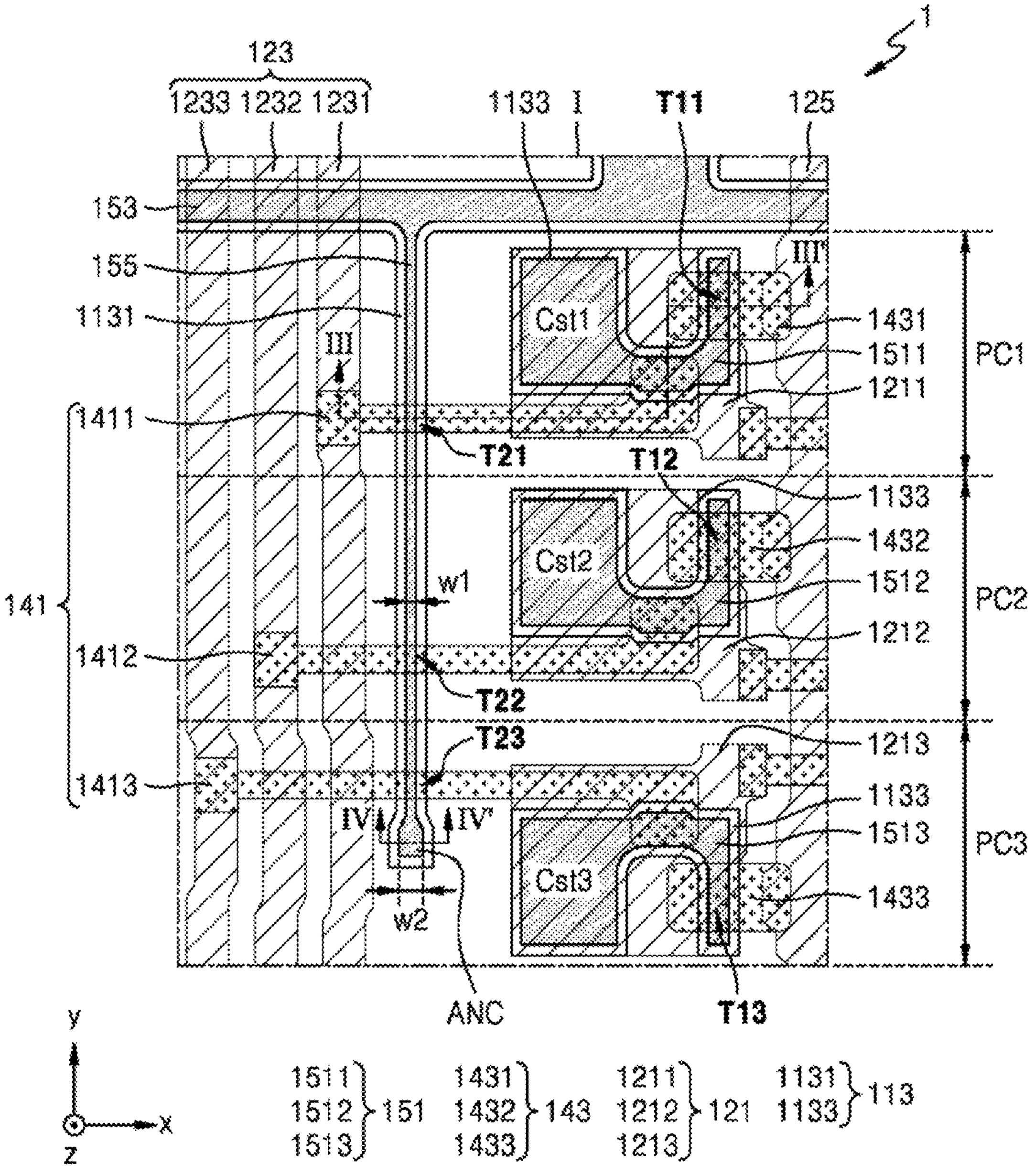
FIG. 4 is a schematic plan view of a portion of a display apparatus according to an embodiment.

FIG. 4 is a schematic plan view of a portion of a display apparatus according to an embodiment. FIG. 4 may be a schematic plan view of a region I of the display apparatus 1 illustrated in FIG. 1.

Referring to FIG. 4, the display apparatus 1 according to an embodiment may include a plurality of pixel circuits PC (see FIG. 3B). For example, in FIG. 4, a first pixel circuit PC1, a second pixel circuit PC2 and a third pixel circuit PC3 are arranged in a first direction (e.g., a y direction).

The first pixel circuit PC1 may include a first-1 transistor T11, a second-1 transistor T21, and a first storage capacitor Cst1; the second pixel circuit PC2 may include a first-2 transistor T12, a second-2 transistor T22, and a second storage capacitor Cst2; and the third pixel circuit PC3 may include a first-3 transistor T13, a second-3 transistor T23, and a third storage capacitor Cst3.

The first-1 transistor T11, the first-2 transistor T12, and the first-3 transistor T13 may each correspond to the first transistor T1 illustrated in FIG. 3B. The second-1 transistor T21, the second-2 transistor T22, and the second-3 transistor T23 may each correspond to the second transistor T2 illustrated in FIG. 3B. The first storage capacitor Cst1, the second storage capacitor Cst2, and the third storage capacitor Cst3 may each correspond to the storage capacitor Cst illustrated in FIG. 3B.

In an embodiment, the first pixel circuit PC1, the second pixel circuit PC2, and the third pixel circuit PC3 may be electrically connected to display elements that emit light of different colors. For example, the first pixel circuit PC1 may be electrically connected to the organic light-emitting diode OLED that emits first color light, the second pixel circuit PC2 may be electrically connected to the organic light-emitting diode OLED that emits second color light, and the third pixel circuit PC3 may be electrically connected to the organic light-emitting diode OLED that emits third color light.

Data lines 123, scan lines 153, and a power line 125 may be disposed on the substrate 100. Each of the data lines 123 may correspond to the data line DL illustrated in FIG. 3, the scan lines 153 may correspond to the scan line SL, and the power line 125 may correspond to the power line PL.

The data lines 123 may include a first data line 1231 connected to a drain of the second-1 transistor T21, a second data line 1232 connected to a drain of the second-2 transistor T22, and a third data line 1233 connected to a drain of the second-3 transistor T23. The first data line 1231, the second data line 1232, and the third data line 1233 may be spaced apart from one another, and may extend in the first direction (e.g., the y direction).

First semiconductor patterns 141 may be disposed to cross the data lines 123. The first semiconductor patterns 141 may include a first-1 semiconductor pattern 1411, a first-2 semiconductor pattern 1412, and a first-3 semiconductor pattern 1413, which are spaced apart from one another.

The first-1 semiconductor pattern 1411 may be electrically connected to the first data line 1231, and may extend in a second direction (e.g., an x direction). The first-2 semiconductor pattern 1412 may be electrically connected to the second data line 1232, and may extend in the second direction (e.g., the x direction). The first-3 semiconductor pattern 1413 may be electrically connected to the third data line 1233, and may extend in the second direction (e.g., the x direction).

The scan lines 153 may extend in the second direction (e.g., the x direction). The scan lines 153 may include a gate line 155 extending in the first direction (e.g., the y direction) and crossing the first semiconductor patterns 141. The scan lines 153 and the gate line 155 may be integrally provided.

The gate line 155 may overlap the first-1 semiconductor pattern 1411 and function as a gate electrode of the second-1 transistor T21, overlap the first-2 semiconductor pattern 1412 and function as a gate electrode of the second-2 transistor T22, and overlap the first-3 semiconductor pattern 1413 and function as a gate electrode of the second-3 transistor T23. In other words, the gate line 155 may be integrally provided across the pixel circuits PC1, PC2, and PC3 arranged in in the first direction (e.g., the y direction).

An anchor ANC may be located at one end portion (in a −y direction) of the gate line 155. For example, the other end portion (in +y direction) of the gate line 155 may be connected to the scan lines 153, and the one end portion (in the −y direction) of the gate line 155 may be connected to the anchor ANC. The anchor ANC may be integrally provided with the gate line 155, and may have a width greater than the width of the gate line 155. For example, when the gate line 155 has a first width w1 in the second direction (e.g., the x direction), the anchor ANC may have a second width w2 in the second direction (e.g., the x direction) that is greater than the first width w1. The first width w1 may be about 2 μm or less, and the second width w2 may be greater than about 2 μm.

Referring to FIG. 4, as the gate line 155 extends from the scan lines 153 to the third pixel circuit PC3 across the first pixel circuit PC1 and the second pixel circuit PC2, the anchor ANC may be arranged to overlap the third pixel circuit PC3.

First electrodes 151 may be disposed on the substrate 100. The first electrodes 151 may include a first-1 electrode 1511, a first-2 electrode 1512, and a first-3 electrode 1513. The first electrodes 151 may correspond to the first electrode CG1 of the storage capacitor Cst illustrated in FIG. 3B. A second electrode 121 may be disposed to overlap the first electrodes 151. The second electrode 121 may include a second-1 electrode 1211 overlapping the first-1 electrode 1511, a second-2 electrode 1212 overlapping the first-2 electrode 1512, and a second-3 electrode 1213 overlapping the first-3 electrode 1513. The second electrode 121 may correspond to the second electrode CE2 of the storage capacitor Cst illustrated in FIG. 3B. In other words, the first storage capacitor Cst1 may include the first-1 electrode 1511 and the second-1 electrode 1211 overlapping the first-1 electrode 1511, the second storage capacitor Cst2 may include the first-2 electrode 1512 and the second-2 electrode 1212 overlapping the first-2 electrode 1512, and the third storage capacitor Cst3 may include the first-3 electrode 1513 and the second-3 electrode 1213 overlapping the first-3 electrode 1513.

The first-1 electrode 1511 may be electrically connected to the first-1 semiconductor pattern 1411. For example, the first-1 semiconductor pattern 1411 may extend from the first data line 1231 to the first-1 electrode 1511. A portion of the first-1 semiconductor pattern 1411 may overlap the second-1 electrode 1211.

The first-2 electrode 1512 may be electrically connected to the first-2 semiconductor pattern 1412. The first-2 semiconductor pattern 1412 may extend from the second data line 1232 to the first-2 electrode 1512. A portion of the first-2 semiconductor pattern 1412 may overlap the second-2 electrode 1212.

The first-3 electrode 1513 may be electrically connected to the first-3 semiconductor pattern 1413. The first-3 semiconductor pattern 1413 may extend from the third data line 1233 to the first-3 electrode 1513. A portion of the first-3 semiconductor pattern 1413 may overlap the second-3 electrode 1213.

Second semiconductor patterns 143 may be arranged between the first electrodes 151 and the second electrode 121. The second semiconductor patterns 143 may include a second-1 semiconductor pattern 1431 provided between the first-1 electrode 1511 and the second-1 electrode 1211, a second-2 semiconductor pattern 1432 provided between the first-2 electrode 1512 and the second-2 electrode 1212, and a second-3 semiconductor pattern 1433 provided between the first-3 electrode 1513 and the second-3 electrode 1213.

One end portion (in the −x direction) of the second-1 semiconductor pattern 1431 may be electrically connected to the second-1 electrode 1211. The other end portion of (in the +x direction) of the second-1 semiconductor pattern 1431 may be electrically connected to the power line 125. A portion of the first-1 electrode 1511 may overlap the second-1 semiconductor pattern 1431 and function as the gate electrode of the first-1 transistor T11. In other words, the first electrode CG1 (see FIG. 3B) of the first storage capacitor Cst1 and the gate electrode of the first-1 transistor T11 may be integrally provided.

One end portion (in the −x direction) of the second-2 semiconductor pattern 1432 may be electrically connected to the second-2 electrode 1212. The other end portion (in the +x direction) of the second-2 semiconductor pattern 1432 may be electrically connected to the power line 125. One portion of the first-2 electrode 1512 may overlap the second-2 semiconductor pattern 1432 and function as the gate electrode of the first-2 transistor T12. The first electrode CG1 (see FIG. 3B) of the second storage capacitor Cst2 and the gate electrode of the first-2 transistor T12 may be integrally provided.

One end portion (in the −x direction) of the second-3 semiconductor pattern 1433 may be electrically connected to the second-3 electrode 1213. A portion of the first-3 electrode 1513 may overlap the second-3 semiconductor pattern 1433 and function as the gate electrode of the first-3 transistor T13. The first electrode CG1 (see FIG. 3B) of the third storage capacitor Cst3 and the gate electrode of the first-3 transistor T13 may be integrally provided.

A gate insulating layer 113 may be disposed below the scan lines 153, the gate line 155, and the first electrodes 151. The gate insulating layer 113 may be disposed between the gate line 155 and the first semiconductor patterns 141 and between the first electrodes 151 and the second semiconductor patterns 143. The gate insulating layer 113 may include a first insulating pattern 1131 overlapping the scan lines 153, the gate line 155, and the anchor ANC, and second insulating patterns 1133 overlapping the first electrodes 151. The first insulating pattern 1131 may have a shape that matches the shapes of the scan lines 153, the gate line 155, and the anchor ANC. Each of the second insulating patterns 1133 may have a shape that matches the shape of the first-1 electrode 1511, the first-2 electrode 1512, and the first-3 electrode 1513.

As used herein, when "A has a shape that matches the shape of B," it may mean that A and B are formed using the same mask, and have a similar shape in a plan view without necessarily having the same size. For example, like the scan lines 153, the gate line 155, and the anchor ANC, the first insulating pattern 1131 may be formed using the same photoresist pattern as a mask. In this state, the scan lines 153, the gate line 155 and the anchor ANC may be formed by wet etching a metal layer using a photoresist pattern as a mask, and the first insulating pattern 1131 may be formed by dry etching an inorganic insulating layer using a photoresist pattern as a mask. Accordingly, the scan lines 153, the gate line 155, the anchor ANC, and the first insulating pattern 1131 may each have a matching shape as—or a shape similar to—the shape of a photoresist pattern, but the width thereof may vary due to a difference in the properties of a material and an etching process. For example, the width of the first insulating pattern 1131 may be greater than the width of each of the scan lines 153, the gate line 155, and the anchor ANC. Accordingly, the first insulating pattern 1131 may have a shoulder portion extending to the outside of the scan lines 153, the gate line 155, and the anchor ANC. Likewise, each of the second insulating patterns 1133 may have a shoulder portion extending beyond the edges of the first electrodes 151 corresponding thereto.

In an embodiment, the second electrode 121 may be connected to the drain of the third transistor T3 (see FIG. 3B) or to a separate bias wire (not shown).

In FIG. 4, although a structure in which the anchor ANC is arranged at one end portion of the gate line 155 that functions as the gate electrodes of the second-1 transistor T21, the second-2 transistor T22, and the second-3 transistor T23 is described, the disclosure is not limited thereto. The display apparatus 1 may further include wires each having a high aspect ratio and functioning as a gate electrode. For example, when the display apparatus 1 includes the third transistor T3 (see FIG. 3B), the anchor ANC may be arranged at one end portion of the gate line 155 functioning as the gate electrode of the third transistor T3 (see FIG. 3B).

Figure 5:
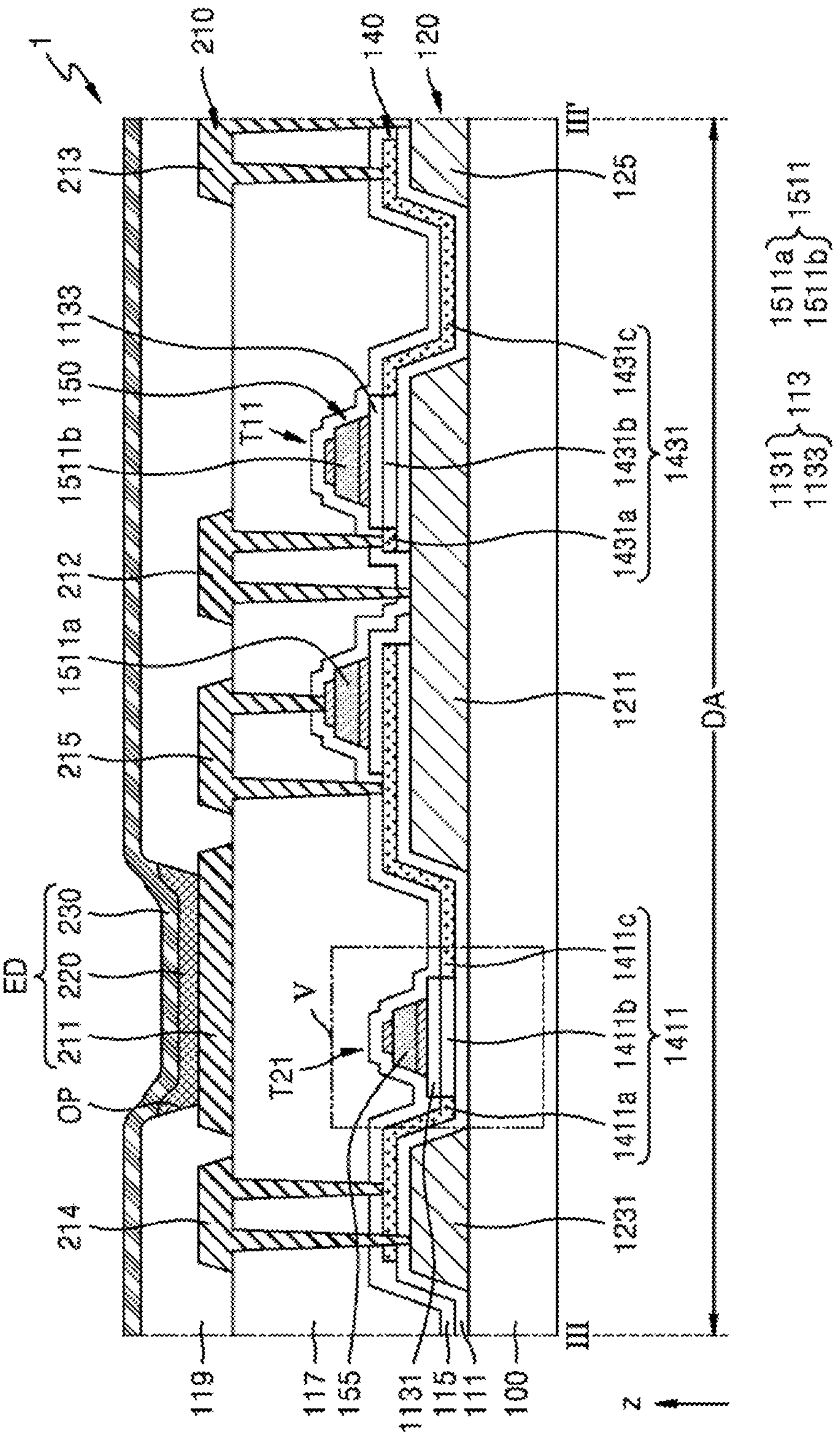
FIG. 5 is a schematic cross-sectional view of the display apparatus of FIG. 4 taken along a line III-III'.

FIG. 5 is a schematic cross-sectional view of the display apparatus 1 of FIG. 4 taken along a line III-III'.

Referring to FIG. 5, the display apparatus 1 may include the substrate 100. The first-1 transistor T11, the second-1 transistor T21, and the organic light-emitting diode OLED may be arranged in the display area DA of the substrate 100.

A buffer layer 111 may be disposed on the substrate 100. The buffer layer 111 may reduce or prevent infiltration of foreign materials, such as moisture or air, from under the substrate 100. The buffer layer 111 may include an inorganic material, such as an oxide or a nitride, an organic material, or an organic/inorganic complex. The buffer layer 111 may have a single layer or multilayer structure.

A semiconductor layer 140 may be disposed on the buffer layer 111.

The semiconductor layer 140 may include an oxide semiconductor material. For example, the semiconductor layer 140 may include an oxide of at least one material selected from among indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layer 140 may include an ITZO (InSnZnO) semiconductor layer, an IGZO (InGaZnO) semiconductor layer, and the like.

As the oxide semiconductor material exhibits a wide band gap of about 3.1 eV, a high carrier mobility, and a low leakage current, an oxide semiconductor transistor does not have a large voltage drop even when driving time is long, and thus, during a low frequency driving, a luminance change according to the voltage drop is small.

In another embodiment, the semiconductor layer 140 may include amorphous silicon or polysilicon.

The semiconductor layer 140 may include the first-1 semiconductor pattern 1411 and the second-1 semiconductor pattern 1431. The first-1 semiconductor pattern 1411 and the second-1 semiconductor pattern 1431 may each include a semiconductor region and conductive regions arranged between the semiconductor regions and facing each other. The first-1 semiconductor pattern 1411 may include a first-1 conductive region 1411*a*, a first semiconductor region 1411*b*, and a first-2 conductive region 1411*c*. The second-1 semiconductor pattern 1431 may include a second-1 conductive region 1431*a*, a second semiconductor region 1431*b*, and a second-2 conductive region 1431*c*.

A first conductive layer 120 may be arranged between the substrate 100 and the buffer layer 111.

The first conductive layer 120 may include a conductive material including molybdenum (Mo), Al, copper (Cu), Ti, and the like. The first conductive layer 120 may be formed in a multilayer or single layer structure including the conductive materials described above. For example, the first conductive layer 120 may have a multilayer structure of Ti/Al/Ti.

The first conductive layer 120 may include the first data line 1231, the second-1 electrode 1211, and the power line 125.

The first data line 1231 may overlap a portion of the first-1 semiconductor pattern 1411. For example, a portion of the first-1 conductive region 1411*a* of the first-1 semiconductor pattern 1411 may be located on the first data line 1231. The first data line 1231 may be electrically connected to the first-1 conductive region 1411*a*. The first data line 1231 may correspond to the data line DL (see FIG. 3B), and the first-1 conductive region 1411*a* may correspond to the drain of the second-1 transistor T21.

The second-1 electrode 1211 may overlap a portion of the first-1 semiconductor pattern 1411 and a portion of the second-1 semiconductor pattern 1431. For example, a portion of the first-2 conductive region 1411*c* of the first-1 semiconductor pattern 1411 may be located above the second-1 electrode 1211. The second-1 conductive region 1431*a*, of the second semiconductor region 1431*b* and the second-2 conductive region 1431*c* of the second-1 semiconductor pattern 1431 may be located above the second-1 electrode 1211. The second-1 electrode 1211 may overlap at least the second semiconductor region 1431*b* of the second-1 semiconductor pattern 1431.

The second-1 electrode 1211 may be electrically connected to the second-1 conductive region 1431*a* of the second-1 semiconductor pattern 1431. The second-1 electrode 1211 may correspond to the second electrode CE2 (see FIG. 3B) of the first storage capacitor Cst1 (see FIG. 4), and the second-1 conductive region 1431*a* of the second-1 semiconductor pattern 1431 may correspond to the source of the first-1 transistor T11.

When the semiconductor layer 140 includes an oxide semiconductor material, the semiconductor layer 140 may be susceptible to light. The second-1 electrode 1211 may reduce or prevent the device characteristics of the first-1 transistor T11 from being changed due to a photocurrent induced in the second semiconductor region 1431*b* of the second-1 semiconductor pattern 1431 by external light input from the substrate 100.

The second-1 electrode 1211 may be electrically connected to the second-1 conductive region 1431*a* of the second-1 semiconductor pattern 1431. The second-1 electrode 1211 may correspond to the first electrode CG1 (see FIG. 3B) of the first storage capacitor Cst1 (see FIG. 4), and the second-1 conductive region 1431*a* of the second-1 semiconductor pattern 1431 may correspond to the source of the first-1 transistor T11.

The power line 125 may overlap a portion of the second-1 semiconductor pattern 1431. For example, the second-2 conductive region 1431*c* of the second-1 semiconductor pattern 1431 may be located above the power line 125. The power line 125 may be electrically connected to the second-2 conductive region 1431*c* of the second-1 semiconductor pattern 1431. The power line 125 may correspond to the power line PL (see FIG. 3B), and the second-2 conductive region 1431*c* of the second-1 semiconductor pattern 1431 may correspond to the drain of the first-1 transistor T11.

The gate insulating layer 113 may be disposed on the semiconductor layer 140. The gate insulating layer 113 may include a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), or the like.

The gate insulating layer 113 may include the first insulating pattern 1131 and the second insulating patterns 1133. The first insulating pattern 1131 may be patterned to overlap a portion of the first-1 semiconductor pattern 1411. For example, the first insulating pattern 1131 may be arranged to expose the first-1 conductive region 1411*a* and the first-2 conductive region 1411*c* of the first-1 semiconductor pattern 1411. The second insulating patterns 1133 may be patterned to overlap a portion of the second-1 semiconductor pattern 1431. For example, the second insulating patterns 1133 may be arranged to expose the second-1 conductive region 1431*a* and the second-2 conductive region 1431*c* of the second-1 semiconductor pattern 1431.

An area where the gate insulating layer 113 overlaps the semiconductor layer 140 may function as a semiconductor region. For example, the first semiconductor region 1411*b* of the first-1 semiconductor pattern 1411 overlapping the first insulating pattern 1131 may function as the semiconductor region of the second-1 transistor T21, and the second semiconductor region 1431*b* of the second-1 semiconductor pattern 1431, overlapping the second insulating patterns 1133 may function as the semiconductor region of the first-1 transistor T11. The conductive regions of the semiconductor layer 140 undergo a doping process by plasma processing and the like. In this state, a portion of the semiconductor layer 140 overlapping the gate insulating layer 113 is not subjected to the plasma processing, and therefore has a characteristic different from the conductive regions.

A second conductive layer 150 may be disposed on the gate insulating layer 113.

The second conductive layer 150 may include a conductive material including Mo, Al, Cu, Ti, and the like. The second conductive layer 150 may be formed in a multilayer or single layer structure including the conductive materials described above. For example, the second conductive layer 150 may have a multilayer structure of Ti/Al/Ti. Alternatively, the second conductive layer 150 may have a multilayer structure of Ti/Cu/Ti/Cu.

The second conductive layer 150 may include the gate line 155 and the first-1 electrode 1511. The gate line 155 may overlap the first semiconductor region 1411*b* of the first-1 semiconductor pattern 1411. The first-1 electrode 1511 may include a first portion 1511*a* overlapping at least a portion of the first-2 conductive region 1411*c* of the first-1 semiconductor pattern 1411, and a second portion 1511*b* overlapping the second semiconductor region 1431*b* of the second-1 semiconductor pattern 1431. In a plan view, the first portion 1511*a* and the second portion 1511*b* of the first-1 electrode 1511 may be integrally provided.

A first insulating layer 115 may be arranged to cover the buffer layer 111, the semiconductor layer 140, and the second conductive layer 150. The first insulating layer 115 may include $SiO_2$, $SiN_x$ or SiON, and the like. The first insulating layer 115 may have a single layer or multilayer structure.

A second insulating layer 117 may be disposed on the first insulating layer 115. The second insulating layer 117 may provide a flat upper surface to the constituent elements disposed on the second insulating layer 117. The second insulating layer 117 may include a general purpose polymer such as benzocyclobutene (BCB), polyimide, hexamethyldisiloxane (HMDSO), polymethylmethacrylate (PMMA), and polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and blends thereof, and the like.

A third conductive layer 210 may be disposed on the second insulating layer 117. The third conductive layer 210 may be a (semi-)light-transmissive electrode layer or a reflective electrode layer. The third conductive layer 210 may include a reflective layer including Ag, Mg, Al, Pt, Pd, Au, Ni, Nd, Ir, Cr, a compound thereof, and the like, and a transparent or translucent electrode layer on the reflective layer. The transparent or translucent electrode layer may include at least one material selected from among an indium tin oxide (ITO), an indium zinc oxide (IZO), a zinc oxide (ZnO), an indium oxide ($In_2O_3$), an indium gallium oxide (IGO), and an aluminum zinc oxide (AZO). In some embodiments, the third conductive layer 210 may have a multilayer structure of ITO/Ag/ITO.

The third conductive layer 210 may include a pixel electrode 211, a first connection electrode 212, a second connection electrode 213, a third connection electrode 214, and a fourth connection electrode 215.

The first connection electrode 212 may be electrically connected to the second-1 electrode 1211, the second-1 conductive region 1431*a* of the second-1 semiconductor pattern 1431, and the pixel electrode 211. For example, in a plan view, the first connection electrode 212 may be integrally provided with the pixel electrode 211. The first connection electrode 212 may electrically connect the first storage capacitor Cst1, the source of the first-1 transistor T11, and the pixel electrode 211 to one another.

The second connection electrode 213 may be electrically connected to the power line 125 and the second-2 conductive region 1431*c* of the second-1 semiconductor pattern 1431. The second connection electrode 213 may electrically connect the power line 125 to the drain of the first-1 transistor T11.

The third connection electrode 214 may be electrically connected to the first data line 1231 and the first-1 conductive region 1411*a* of the first-1 semiconductor pattern 1411. The third connection electrode 214 may electrically connect the first data line 1231 to the drain of the second-1 transistor T21.

The fourth connection electrode 215 may be electrically connected to the first-2 conductive region 1411*c* of the first-1 semiconductor pattern 1411 and the first portion 1511*a* of the first-1 electrode 1511. The fourth connection electrode 215 may electrically connect the source of the second-1 transistor T21 to the first-1 electrode 1511 of the first storage capacitor Cst1.

A pixel defining layer 119 may be disposed on the second insulating layer 117 and the third conductive layer 210. The pixel defining layer 119 may cover an edge of the pixel electrode 211. The pixel defining layer 119 may define an opening OP that exposes a central portion of the pixel electrode 211. The opening OP may define an emission area of the organic light-emitting diode OLED.

The pixel defining layer 119 may prevent occurrence of arc and the like at an edge of the pixel electrode 211 by increasing a distance between the edge of the pixel electrode 211 and a counter electrode 230. The pixel defining layer 119 may be formed of one or more organic insulating materials selected from among polyimide, polyamide, acryl resin, benzocyclobutene, and phenol resin, by a method such as spinning coating and the like.

In an embodiment, the pixel defining layer 119 may include a light blocking material, and may be provided in black. The light blocking material may include resin or paste including carbon black, carbon nanotube, or black dye, metal (e.g., nickel, aluminum, molybdenum, or an alloy thereof) particles, metal oxide (e.g., a chromium oxide) particles, metal nitride (e.g., a chromium nitride) particles, and the like. When the pixel defining layer 119 includes a light blocking material, external light reflection by the conductive layers arranged below the pixel defining layer 119 may be reduced.

An emission layer 220 may be arranged within the opening OP defined by the pixel defining layer 119, and may include an organic material including a fluorescent or phosphorescent material that emits red, green, blue, or white light. The emission layer 220 may include a low molecular weight organic material or a polymer organic material, and function layers, such as a hole transport layer (HTL), a hole injection layer (HIL), an electron transport layer (ETL), an electron injection layer (EIL), and the like, may be further selectively arranged below and above the emission layer 220. These function layers may each be integrally provided over a plurality of organic light-emitting diodes OLEDs.

The counter electrode 230 may include a light-transmissive electrode or a reflective electrode. In an embodiment, the counter electrode 230 may include a transparent or translucent electrode, and may be formed of a metal thin film having a low work function including Li, Ca, AI, Ag, Mg, and a compound thereof (e.g., LiF) and a material with a multilayer structure such as LiF/Ca and LiF/AI. Furthermore, a transparent conductive film including ITO, IZO, ZnO, $In_2O_3$, or the like may be further disposed on the metal thin film. The counter electrode 230 may be arranged across the display area DA (see FIG. 1), and may be disposed on the emission layer 220 and the pixel defining layer 119. The counter electrode 230 may be integrally provided across the organic light-emitting diodes OLEDs.

An encapsulation layer (not shown) may be disposed on the organic light-emitting diode OLED. The encapsulation layer may cover the display area DA, and extend to at least a portion of the peripheral area PA. The encapsulation layer may include at least one inorganic encapsulation layer and at least one organic encapsulation layer.

Figure 6A:
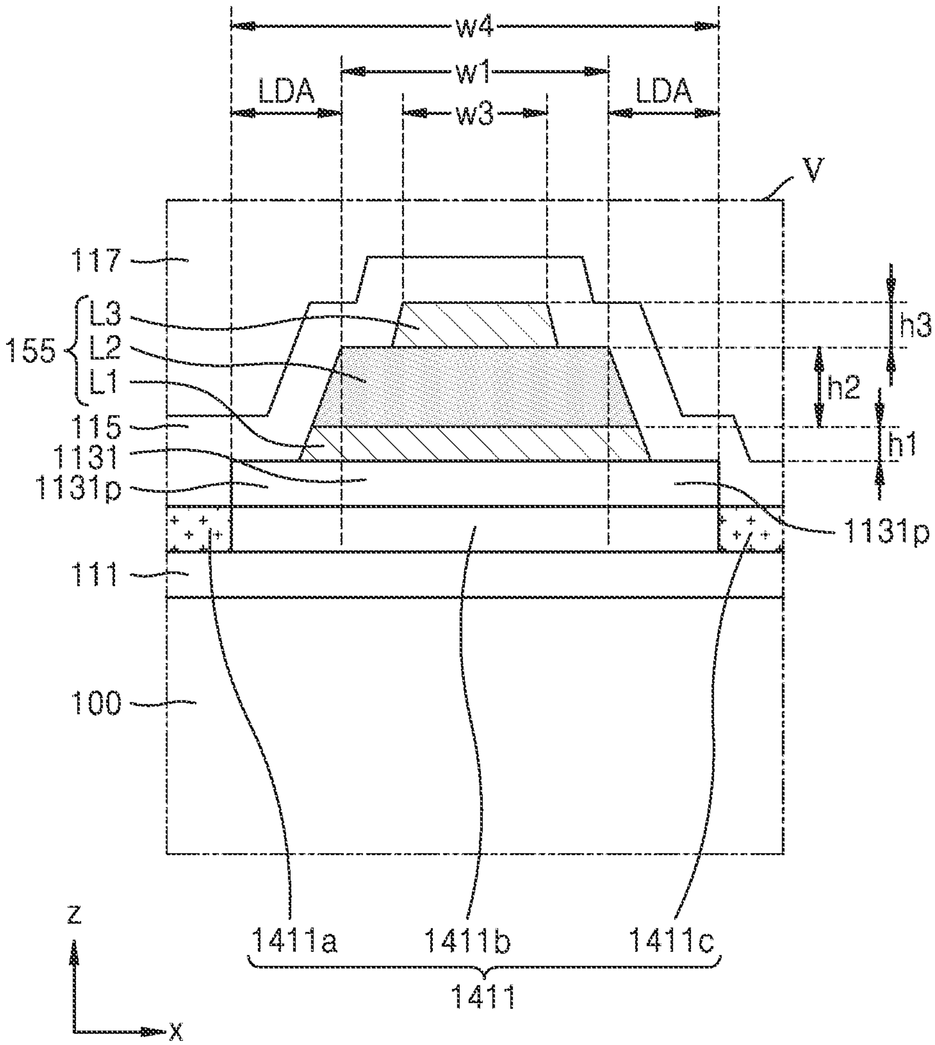
FIGS. 6A and 6B are schematic enlarged cross-sectional views of a portion of a display apparatus according to embodiments.
Figure 6B:
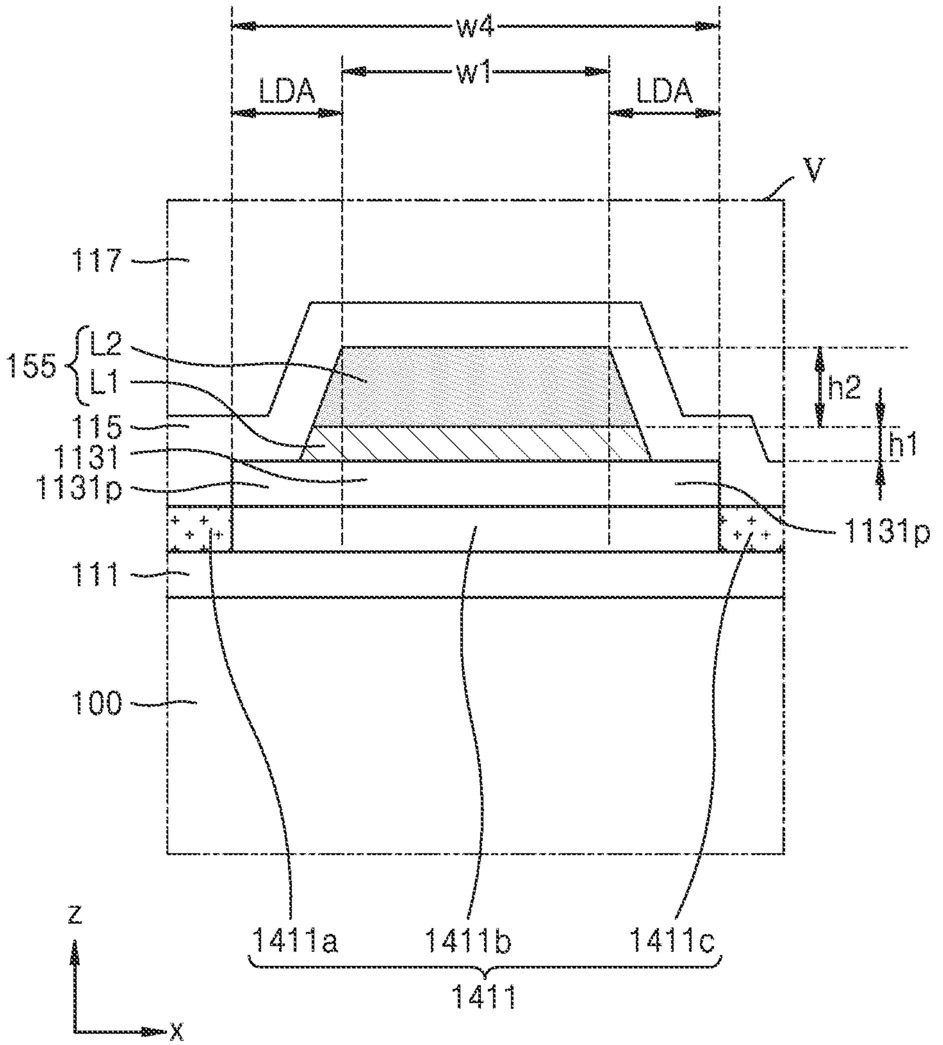
Figure 7:
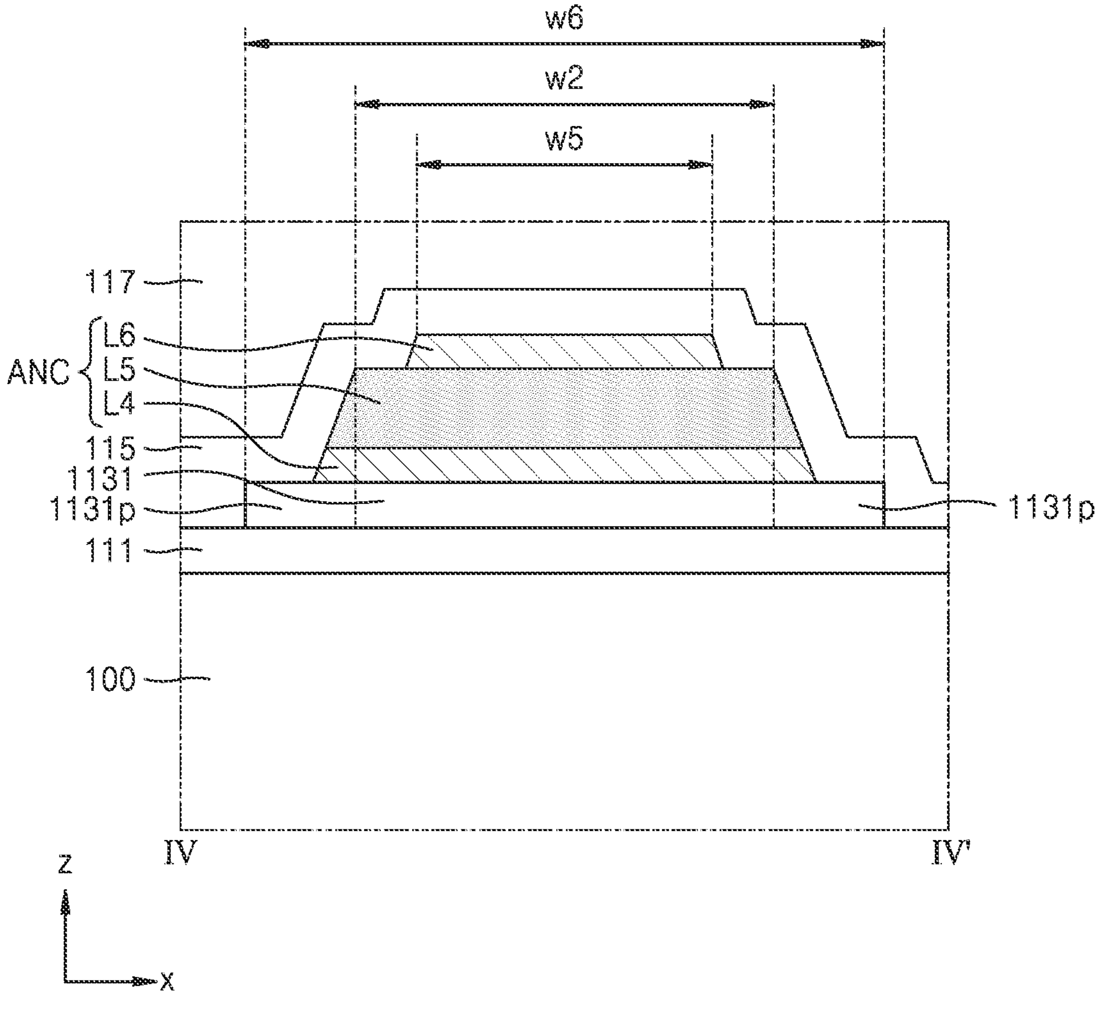
FIG. 7 is a schematic cross-sectional view of the display apparatus of FIG. 4 taken along a line IV-IV'.

FIGS. 6A and 6B are schematic enlarged cross-sectional views of a portion of the display apparatus 1 according to embodiments. FIG. 7 is a schematic cross-sectional view of the display apparatus 1 of FIG. 4 taken along a line IV-IV'

FIGS. 6A and 6B may be cross-sectional views corresponding to a cross-section of a region V of FIG. 5.

Referring to FIG. 6A, the buffer layer 111 may be disposed on the substrate 100, and the first-1 semiconductor pattern 1411 may be disposed on the buffer layer 111.

The first-1 semiconductor pattern 1411 may include the first-1 conductive region 1411*a*, the first semiconductor region 1411*b*, and the first-2 conductive region 1411*c*. The first semiconductor region 1411*b* may be arranged between the first-1 conductive region 1411*a* and the first-2 conductive region 1411*c*.

The first insulating pattern 1131 and the gate line 155 may be disposed on the first-1 semiconductor pattern 1411.

The gate line 155 may have a multilayer structure including a first metal layer L1, a second metal layer L2, and a third metal layer L3, which are sequentially stacked on each other. The first metal layer L1 may include a first metal material, and the second metal layer L2 may include a second metal material different from the first metal material. For example, the first metal layer L1 may include Ti, and the second metal layer L2 may include Cu. The third metal layer L3 may function as a capping layer to provide stability of patterning during a wet etching process. The third metal layer L3 may have a double layer structure of Ti/Cu. Alternatively, the third metal layer L3 may include an ITO layer.

As the second conductive layer 150 (see FIG. 5) includes a signal wire and the like, to have low resistance, the second conductive layer 150 may be formed to have a sufficient height in a third direction (e.g., a z direction). For example, the second metal layer L2 may have a second height h2 of about 6 kÅ to about 11 kÅ. The first metal layer L1 may have a height h1 of about 200 Å. In order to prevent overetching of the upper portion of the second metal layer L2 as the height of the second metal layer L2 increases, the third metal layer L3 functioning as a capping layer may be formed. When the third metal layer L3 has a double layer structure of Ti/Cu, the third metal layer L3 may have a third height h3 of about 550 Å.

The gate line 155 may have the first width w1 in the second direction (e.g., the x direction). As the second metal layer L2 has the second height h2 of about 6 kÅ to about 11 kÅ, in the wet etching process, the upper portion of the second metal layer L2 may be etched rapidly. Accordingly, the second metal layer L2 may have a cross-section of a trapezoidal shape in which the width of an upper surface is less than the width of a lower surface. The first width w1 of the gate line 155 in the second direction (e.g., the x direction) may be defined based on the width of the upper surface of the second metal layer L2. The first width w1 may be about 2 μm or less.

In the wet etching process to pattern the gate line 155, the third metal layer L3 is eroded to have a third width w3 less than the first width w1. In a plan view, the third metal layer L3 may be located inside the upper surface of the second metal layer L2.

In an embodiment, as illustrated in FIG. 6B, the gate line 155 may include only the first metal layer L1 and the second metal layer L2. As the second metal layer L2 has the second height h2 of about 6 kÅ to about 11 kÅ, in the wet etching process of the gate line 155, the third metal layer L3 may be eroded about 0.8 μm to 1.0 μm inwardly from the boundary of the upper surface of the second metal layer L2. Accordingly, when the first width w1 of the gate line 155 in the second direction (e.g., the x direction) is about 2 μm or less, the third metal layer L3 on the second metal layer L2 may be completely removed.

As described above with reference to FIG. 4, the first insulating pattern 1131 may have a shape that matches that of the gate line 155.

In other words, a photoresist pattern used as a mask in the wet etching process to form the gate line 155 may be used as a mask in a dry etching process to form the first insulating pattern 1131. Accordingly, in a plan view, while having a similar shape, the gate line 155 and the first insulating pattern 1131 may have different widths due to a difference in the characteristics of a material and the etching process.

When the gate line 155 has the first width w1 in the second direction (e.g., the x direction), a fourth width w4 of the first insulating pattern 1131 in the second direction (e.g., the x direction) may be greater than the first width w1. In other words, the first insulating pattern 1131 may include a shoulder portion 1131*p* extending beyond the edge of the gate line 155. In a plan view, the gate line 155 may be located inside the first insulating pattern 1131.

The first semiconductor region 1411*b* of the first-1 semiconductor pattern 1411 may overlap the first insulating pattern 1131. While the first-1 semiconductor pattern 1411 undergoes a doping process by plasma processing and the like, a portion of the first-1 semiconductor pattern 1411 overlapping the first insulating pattern 1131 is not subjected to the plasma processing. As a result, the first semiconductor region 1411*b* has a different characteristic form the conductive regions 1411*a*, 1411*c*.

In this state, a lightly doped area LDA may be provided in the first semiconductor region 1411*b* overlapping the shoulder portion 1131*p* of the first insulating pattern 1131. The lightly doped area LDA may be a lightly doped drain (LDD) area that is doped at a lower concentration than that of the first-1 conductive region 1411*a* and the first-2 conductive region 1411*c*. The lightly doped area LDA may improve the reliability of a drain-source voltage of a transistor. There may be a difference in the electrical characteristics between a transistor in which the lightly doped area LDA is formed and a transistor in which the lightly doped area LDA is not formed.

Referring to FIG. 7, the first insulating pattern 1131 may be disposed on the buffer layer 111, and the anchor ANC may be disposed on the first insulating pattern 1131.

The anchor ANC may have a multilayer structure including a fourth metal layer L4, a fifth metal layer L5, and a sixth metal layer L6, which are sequentially stacked on each other. The fourth metal layer L4 may include a first metal material, and the fifth metal layer L5 may include a second metal material different from the first metal material. For example, the fourth metal layer L4 may include Ti, and the fifth metal layer L5 may include Cu. The sixth metal layer L6 may function as a capping layer to secure stability of patterning in the wet etching process. The sixth metal layer L6 may have a double layer structure of Ti/Cu. Alternatively, the sixth metal layer L6 may include an ITO layer.

The anchor ANC may be integrally provided with the gate line 155. Accordingly, the fourth metal layer L4 may include the same material as the first metal layer L1, the fifth metal layer L5 may include the same material as the second metal layer L2, and the sixth metal layer L6 may include the same material as the third metal layer L3.

The anchor ANC may have the second width w2 in the second direction (e.g., the x direction). The second width w2 in the second direction (e.g., the x direction) of the anchor ANC may be defined based on the width of an upper surface of the fifth metal layer L5. The second width w2 may be greater than the first width w1 of the gate line 155. For example, the second width w2 may be greater than about 2 μm.

As the sixth metal layer L6 is eroded in the wet etching process to pattern the anchor ANC, the sixth metal layer L6 may have a fifth width w5 less than the second width w2 in the second direction (e.g., the x direction). In a plan view, the sixth metal layer L6 may be located inside the upper surface of the fifth metal layer L5. As the second width w2 in the second direction (e.g., the x direction) of the anchor ANC is greater than about 2 μm, even when the sixth metal layer L6 is partially eroded during the wet etching process, an attachment surface on which the photoresist pattern and the like is attachable may be provided. A sixth width w6 of the first insulating pattern 1131 in the second direction (e.g., the x direction) may be greater than the second width w2. In other words, the first insulating pattern 1131 may include a shoulder portion 1131*p* extending beyond the edge of the anchor ANC.

In the wet etching process to form the gate line 155, when the third width w3 of the third metal layer L3 in the second direction (e.g., the x direction) is reduced, or the third metal layer L3 is removed, the attachment surface of the photoresist pattern used as a mask may be reduced or lost. As the anchor ANC has the second width w2 greater than the first width w1, the sixth metal layer L6 of the anchor ANC may provide a sufficient attachment surface to the photoresist pattern. Accordingly, the display apparatus 1 according to an embodiment may prevent loss of a portion of the photoresist pattern that is used as a mask in the dry etching process to form the first insulating pattern 1131, thereby reducing the difference in the electrical characteristics between the transistors.

Figure 8:
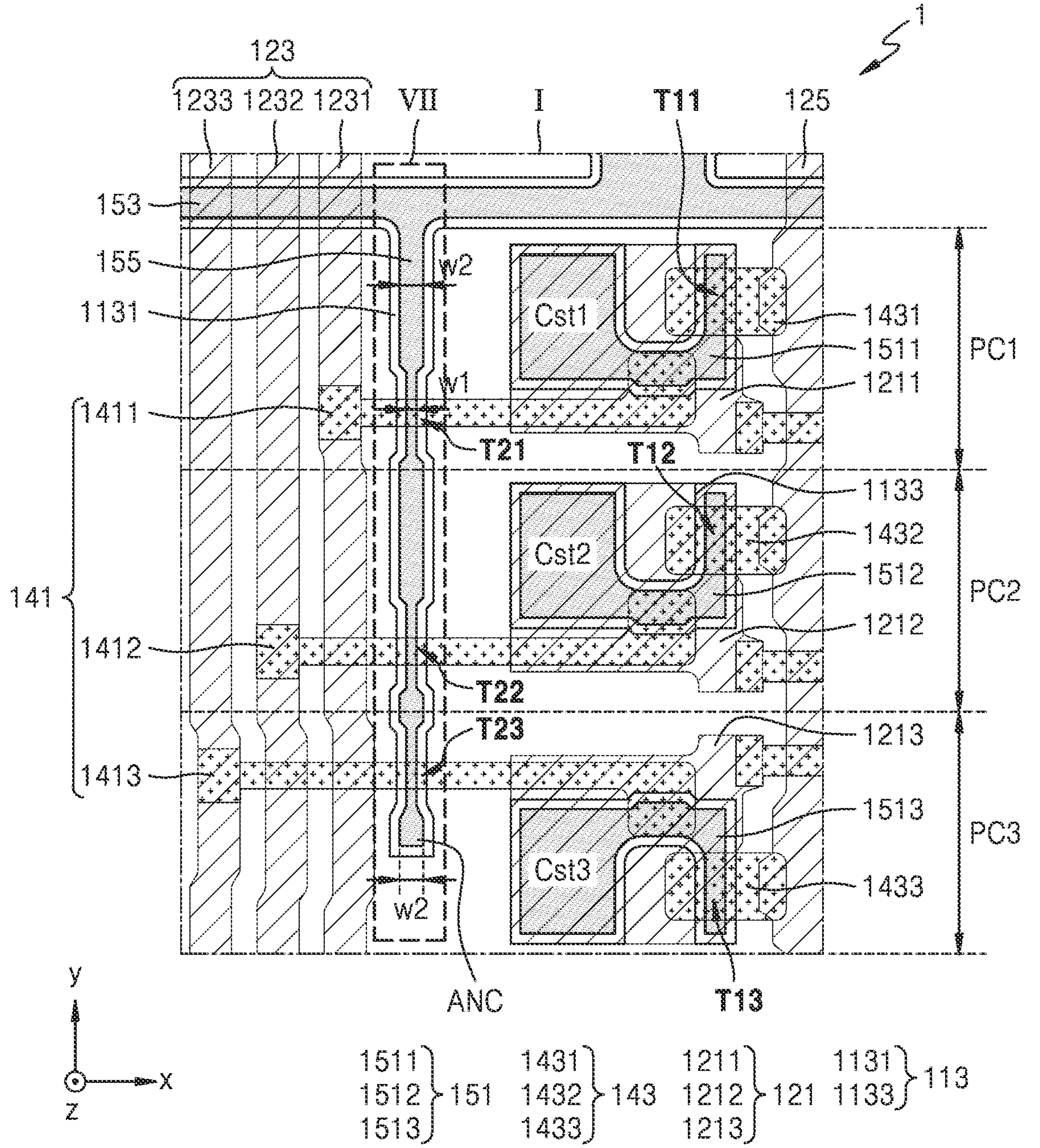
FIG. 8 is a schematic plan view of a portion of a display apparatus according to an embodiment.
Figure 9:
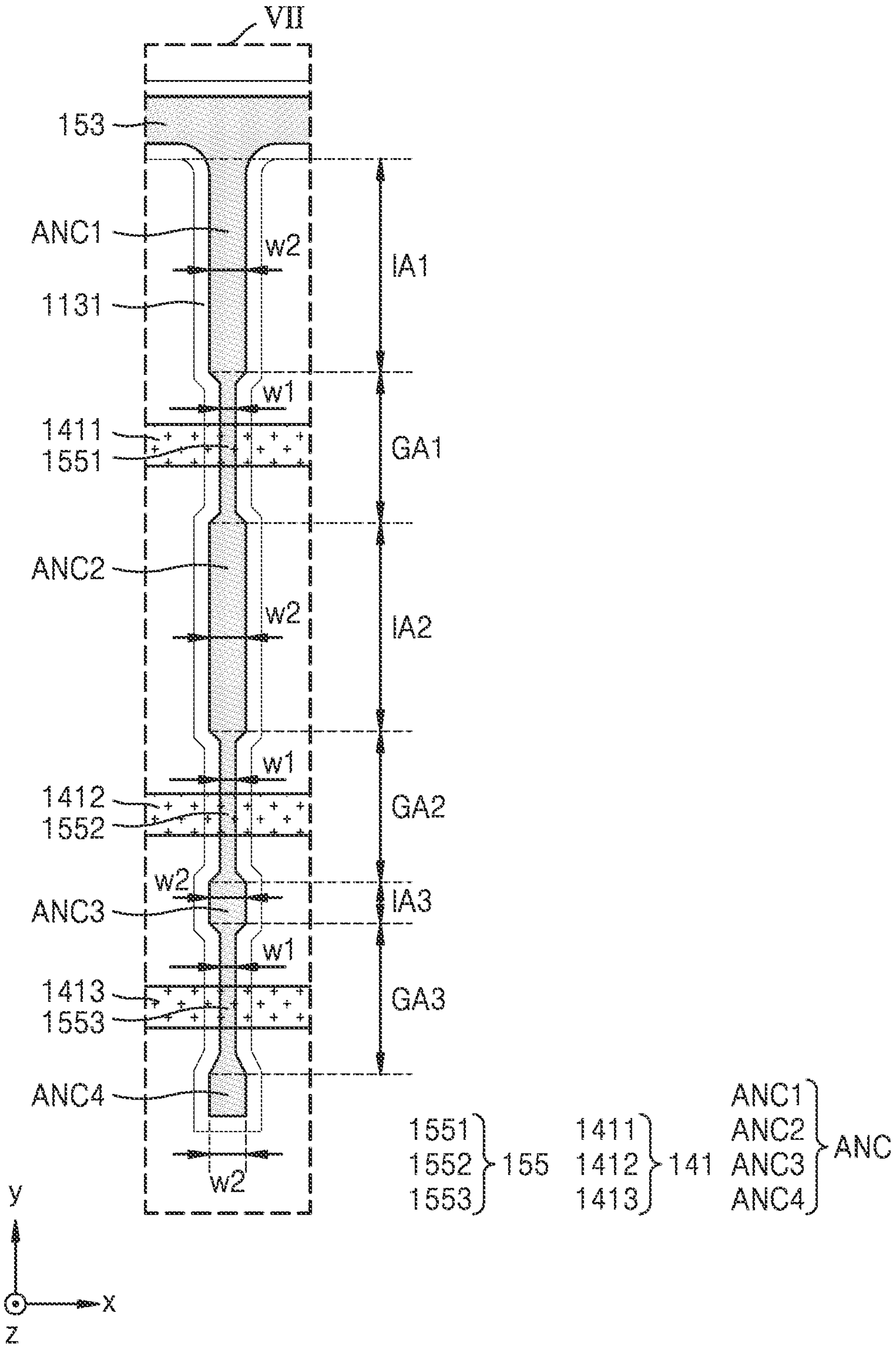
FIG. 9 is a schematic enlarged plan view of a region VII of FIG. 8.

FIG. 8 is a schematic plan view of a portion of the display apparatus 1 according to an embodiment, and FIG. 9 is a schematic enlarged plan view of a region VII of FIG. 8. FIG. 8 is similar to FIG. 4, but has a difference in that the gate line 155 and the anchor ANC are each provided in plural. Hereinbelow, descriptions about the constituent elements that are the same as or similar to those of FIG. 4 are omitted, and a difference is mainly described.

Referring to FIG. 8, the display apparatus 1 according to an embodiment may include a plurality of pixel circuits PC (see FIG. 3B). For example, in FIG. 8, the first pixel circuit PC1, the second pixel circuit PC2, and the third pixel circuit PC3 may be arranged in the first direction (e.g., the y direction).

The data lines 123, the scan lines 153, and the power line 125 may be disposed on the substrate 100.

Each of the data lines 123 may include the first data line 1231 connected to the drain of the second-1 transistor T21, the second data line 1232 connected to the drain of the second-2 transistor T22, and the third data line 1233 connected to the drain of the second-3 transistor T23. The first data line 1231, the second data line 1232, and the third data line 1233 may be spaced apart from one another, and may extend in the first direction (e.g., the y direction).

The first semiconductor patterns 141 may be arranged to cross the data lines 123. The first semiconductor patterns 141 may include the first-1 semiconductor pattern 1411, the first-2 semiconductor pattern 1412, and the first-3 semiconductor pattern 1413, which are spaced apart from one another.

The first-1 semiconductor pattern 1411 may be electrically connected to the first data line 1231, and may extend in the second direction (e.g., the x direction). The first-2 semiconductor pattern 1412 may be electrically connected to the second data line 1232, and may extend in the second direction (e.g., the x direction). The first-3 semiconductor pattern 1413 may be electrically connected to the third data line 1233, and may extend in the second direction (e.g., the x direction).

The scan lines 153 may extend in the second direction (e.g., the x direction). The scan lines 153 may extend in the second direction (e.g., the x direction), and extend in the first direction (e.g., the y direction) to form the gate line 155 and the anchor ANC crossing the first semiconductor patterns 141.

Referring to FIG. 9, the gate line 155 may be provided in plural. For example, the gate line 155 may include a first gate line 1551 overlapping the first-1 semiconductor pattern 1411 and functioning as the gate electrode of the second-1 transistor T21, a second gate line 1552 overlapping the first-2 semiconductor pattern 1412 and functioning as the gate electrode of the second-2 transistor T22, and a third gate line 1553 overlapping the first-3 semiconductor pattern 1413 and functioning as the gate electrode of the second-3 transistor T23. The first gate line 1551 may be arranged in a first gate area GA1 adjacent to the first-1 semiconductor pattern 1411. The second gate line 1552 may be arranged in a second gate area GA2 adjacent to the first-2 semiconductor pattern 1412. The third gate line 1553 may be arranged in a third gate area GA3 adjacent to the first-3 semiconductor pattern 1413.

The anchor ANC may be provided in plural. For example, the anchor ANC may include a first anchor ANC1 arranged in a first area IA1 between the scan lines 153 and the first gate area GA1, a second anchor ANC2 arranged in a second area IA2 between the first gate area GA1 and the second gate area GA2, a third anchor ANC3 arranged in a third area IA3 between the second gate area GA2 and the third gate area GA3, and a fourth anchor ANC4 arranged in one end portion (in the −y direction) of the third gate line 1553.

The scan lines 153, the gate line 155, and the anchor ANC may be integrally provided. For example, the gate line 155 and the anchor ANC may be alternately arranged in the first direction (e.g., the y direction). The first anchor ANC1 may connect the scan lines 153 to one end portion (in the +y direction) of the first gate line 1551. The second anchor ANC2 may connect the other end portion (in the −y direction) of the first gate line 1551 to one end portion (in the +y direction) of the second gate line 1552. The third anchor ANC3 may connect the other end portion (in the −y direction) of the second gate line 1552 and one end portion (in the +y direction) of the third gate line 1553. The fourth anchor ANC4 may be arranged at the other end portion (in the −y direction) of third gate line 1553. The gate line 155 and the anchor ANC share the same extension axis, which is the imaginary straight line that extends in the first direction (e.g., the y-direction) through a center of each of the gate line 155 and the anchor ANC. More specifically, the first gate line 1551, the first anchor ANC1, the second gate line 1552, the second anchor ANC2, the third gate line 1553, the third anchor ANC3, and the fourth anchor ANC4 may share the same extension axis.

The width of the anchor ANC may be greater than the width of the gate line 155. For example, when the first gate line 1551, the second gate line 1552, and the third gate line 1553 each has the first width w1 in the second direction (e.g., the x direction), the first anchor ANC1, the second anchor ANC2, the third anchor ANC3, and the fourth anchor ANC4 may each have the second width w2 in the second direction (e.g., the x direction) that is greater than the first width w1. The first width w1 may be about 2 μm or less, and the second width w2 may be greater than about 2 μm.

The first insulating pattern 1131 may be disposed below the scan lines 153, the gate line 155, and the anchor ANC. The first insulating pattern 1131 may have a shape that matches the shapes of the scan lines 153, the gate line 155, and the anchor ANC.

The width of the first insulating pattern 1131 may be greater than the width of each of the gate line 155 and the anchor ANC. The first insulating pattern 1131 may have a shoulder portion extending beyond the edge of each of the gate line 155 and the anchor ANC.

As described above with reference to FIG. 7, as the second width w2 in the second direction (e.g., the x direction) of the anchor ANC is greater than about 2 μm, even when a portion of the sixth metal layer L6 (see FIG. 7) that is a capping layer is eroded in the wet etching process, the anchor ANC may provide a sufficient attachment surface to which a photoresist pattern and the like is attached. Accordingly, even when the second-1 transistor T21, the second-2 transistor T22, and the second-3 transistor T23 has a short channel of about 2 μm or less, as the shoulder portion of the first insulating pattern 1131 is formed, a difference in the electrical characteristics between the transistors may be reduced.

FIGS. 10A, 10B, 10C, and 10D are schematic cross-sectional views showing some operations of a process of manufacturing a display apparatus according to an embodiment.

Figure 10A:
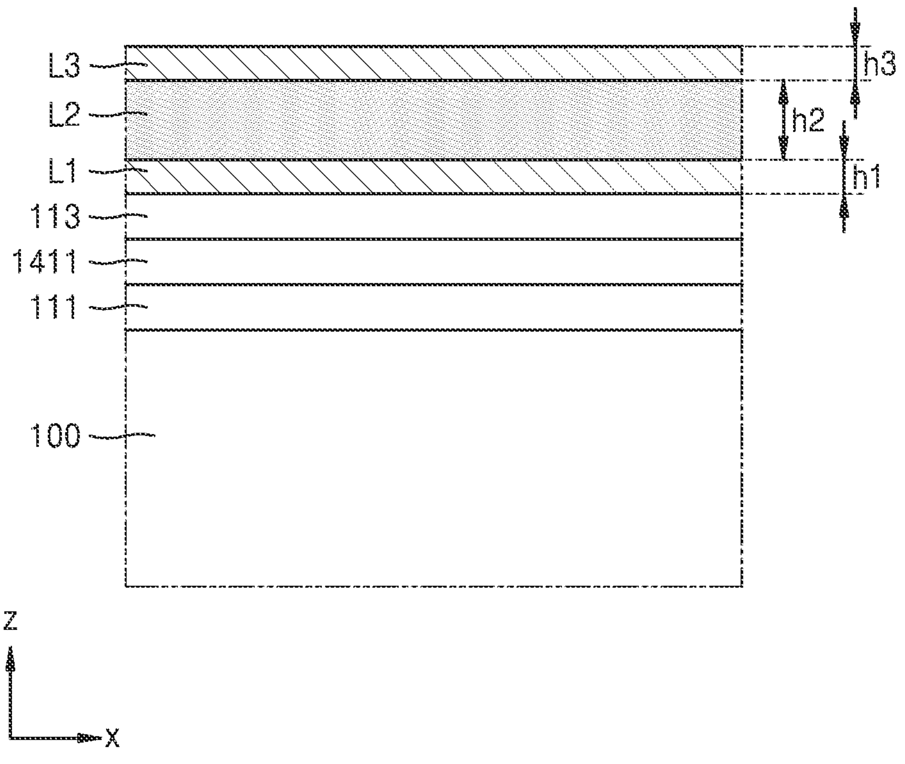
FIGS. 10A to 10D are schematic cross-sectional views showing some operations of a process of manufacturing a display apparatus according to an embodiment.

Referring to FIG. 10A, the buffer layer 111 may be formed on the substrate 100, and the first-1 semiconductor pattern 1411 may be formed on the buffer layer 111.

The first-1 semiconductor pattern 1411 may include an oxide semiconductor material. Alternatively, the first-1 semiconductor pattern 1411 may include amorphous silicon or polysilicon.

The gate insulating layer 113 may be formed to cover the first-1 semiconductor pattern 1411. The gate insulating layer 113 may include $SiO_2$, $SiN_x$, SiON, $Al_2O_3$, $TiO_2$, $Ta_2O_5$, $HfO_2$, $ZnO_2$, or the like. The gate insulating layer 113 may be formed by a method such as chemical vapor deposition (CVD) and the like.

The first metal layer L1, the second metal layer L2, and the third metal layer L3 may be sequentially formed on the gate insulating layer 113. The first metal layer L1 may include a first metal material, and the second metal layer L2 may include a second metal material different from the first metal material. For example, the first metal layer L1 may include Ti, and the second metal layer L2 may include Cu. The third metal layer L3 may be formed in a double layer of Ti/Cu. Alternatively, the third metal layer L3 may be formed as an ITO layer.

The second metal layer L2 may be formed to have the second height h2 of about 6 kÅ to about 11 kÅ. The first metal layer L1 may be formed to have the height h1 of about 200 Å. The third metal layer L3 may be formed to have the third height h3 of about 550 Å.

Figure 10B:
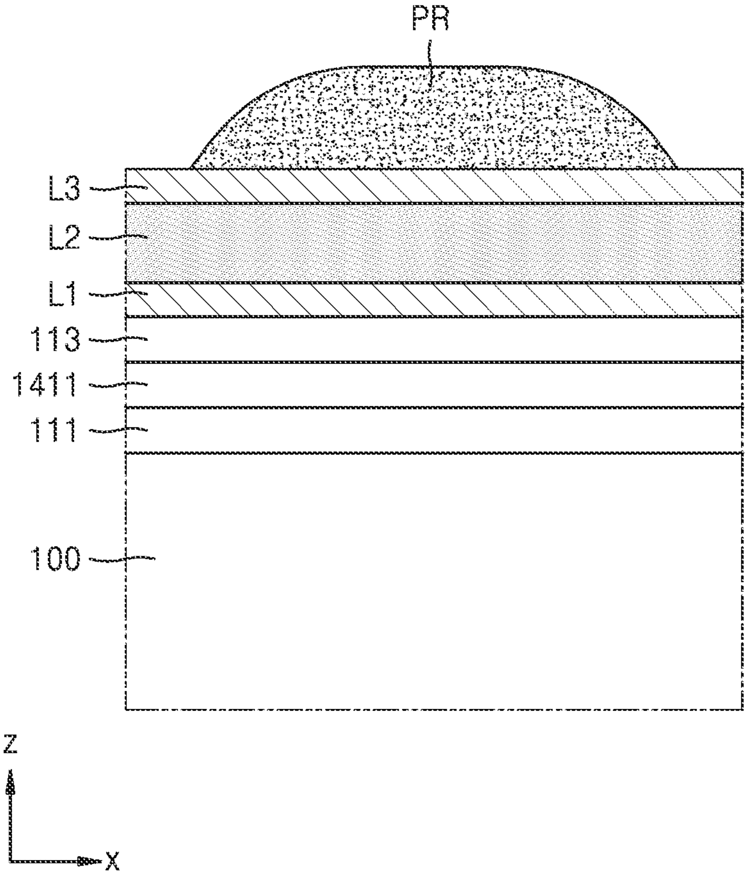

Referring to FIG. 10B, a photoresist pattern PR may be disposed on the third metal layer L3. The photoresist pattern PR may be formed by applying positive-type photoresist liquid or negative-type photoresist liquid onto the third metal layer L3 by various methods, such as spin-coating, spray, immersion, or the like, to form a positive-type photoresist layer or a negative-type photoresist layer, and then removing parts of the positive-type photoresist layer or the negative-type photoresist layer through a development process.

Figure 10C:
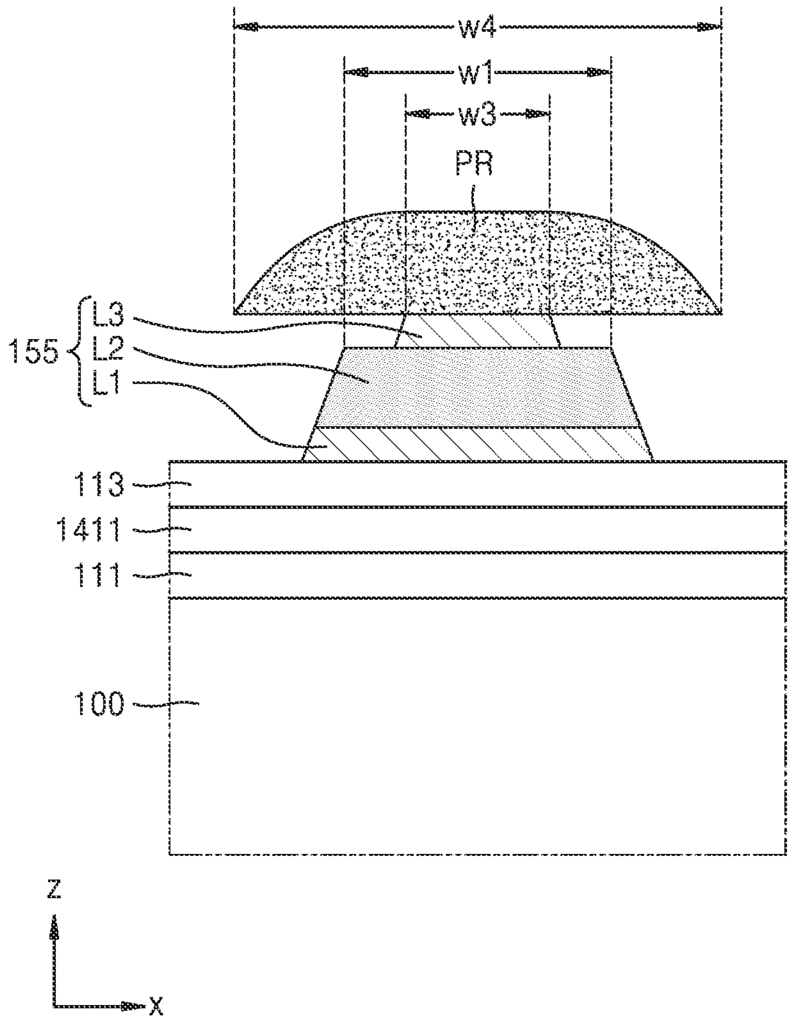

Referring to FIG. 10C, the gate line 155 may be formed by etching a portion of the first metal layer L1, a portion of the second metal layer L2, and a portion of the third metal layer L3 using the photoresist pattern PR as a mask. A process of etching a portion of the first metal layer L1, a portion of the second metal layer L2, and a portion of the third metal layer L3 may include a wet etching process.

The photoresist pattern PR may have the fourth width w4 in the second direction (e.g., the x direction), and the gate line 155 may have the first width w1 that is less than the fourth width w4 in the second direction (e.g., the x direction). As the second metal layer L2 has the second height h2 of about 6 kÅ to about 11 kÅ, the upper portion of the second metal layer L2 may be rapidly etched in the wet etching process. Accordingly, the second metal layer L2 may have the cross-section of a trapezoidal shape in which the width of an upper surface is less than the width of a lower surface. The first width w1 of the gate line 155 in the second direction (e.g., the x direction) may be defined based on the width of the upper surface of the second metal layer L2. The first width w1 may be about 2 μm or less.

In the wet etching process, the third metal layer L3 may be eroded to have the third width w3 that is less than the first width w1. In a plan view, the third metal layer L3 may be located inside the upper surface of the second metal layer L2. Alternatively, as described above with reference to FIG. 6B, the third metal layer L3 on the second metal layer L2 is completely removed, and thus, the gate line 155 may include the first metal layer L1 and the second metal layer L2 only.

The third metal layer L3 provides an attachment surface to the photoresist pattern PR. Even when the third width w3 of the third metal layer L3 in the second direction (e.g., the x direction) is reduced, or the third metal layer L3 is removed, a portion of the photoresist pattern PR may be attached to the sixth metal layer L6 (see FIG. 7) of the anchor ANC (see FIG. 7). Accordingly, the photoresist pattern PR located on the gate line 155 may be maintained as it is without loss.

Figure 10D:
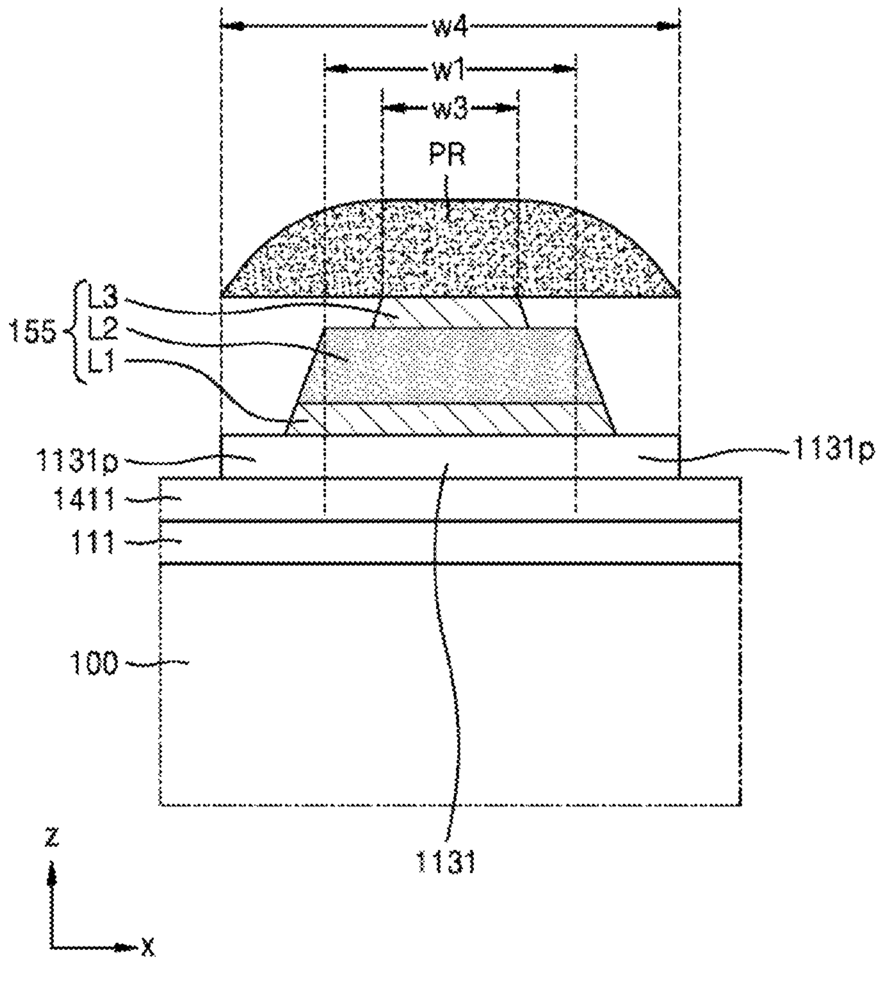

Referring to FIG. 10D, the first insulating pattern 1131 may be formed by etching a portion of the gate insulating layer 113 using the photoresist pattern PR as a mask. The process of etching a portion of the gate insulating layer 113 may include a dry etching process.

The first insulating pattern 1131 may have the fourth width w4 in the second direction (e.g., the x direction). For example, the width of the first insulating pattern 1131 may be substantially the same as the width of the photoresist pattern PR. Accordingly, the fourth width w4 of the first insulating pattern 1131 in the second direction (e.g., the x direction) may be greater than the first width w1 of the gate line 155 in the second direction (e.g., the x direction). The first insulating pattern 1131 may include the shoulder portion 1131*p* extending to the outside of the gate line 155. In a plan view, the gate line 155 may be located inside the first insulating pattern 1131.

Then, in the doping process of the first-1 semiconductor pattern 1411, the lightly doped area LDA (see 6A) may be provided in the first semiconductor region 1411*b* overlapping the shoulder portion 1131*p* of the first insulating pattern 1131.

Figure 11:
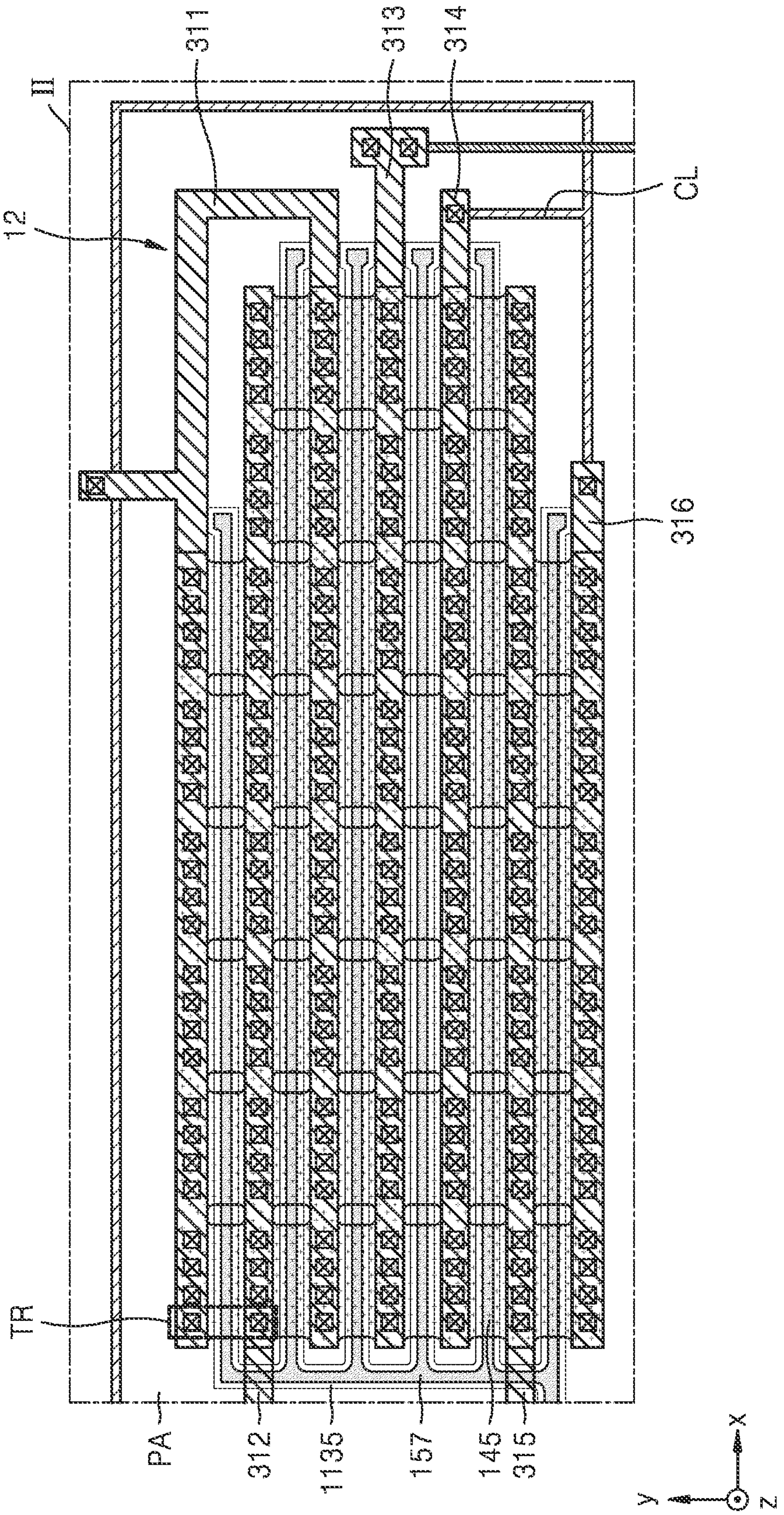
FIG. 11 is a schematic plan view of a portion of a display apparatus according to an embodiment.
Figure 12A:
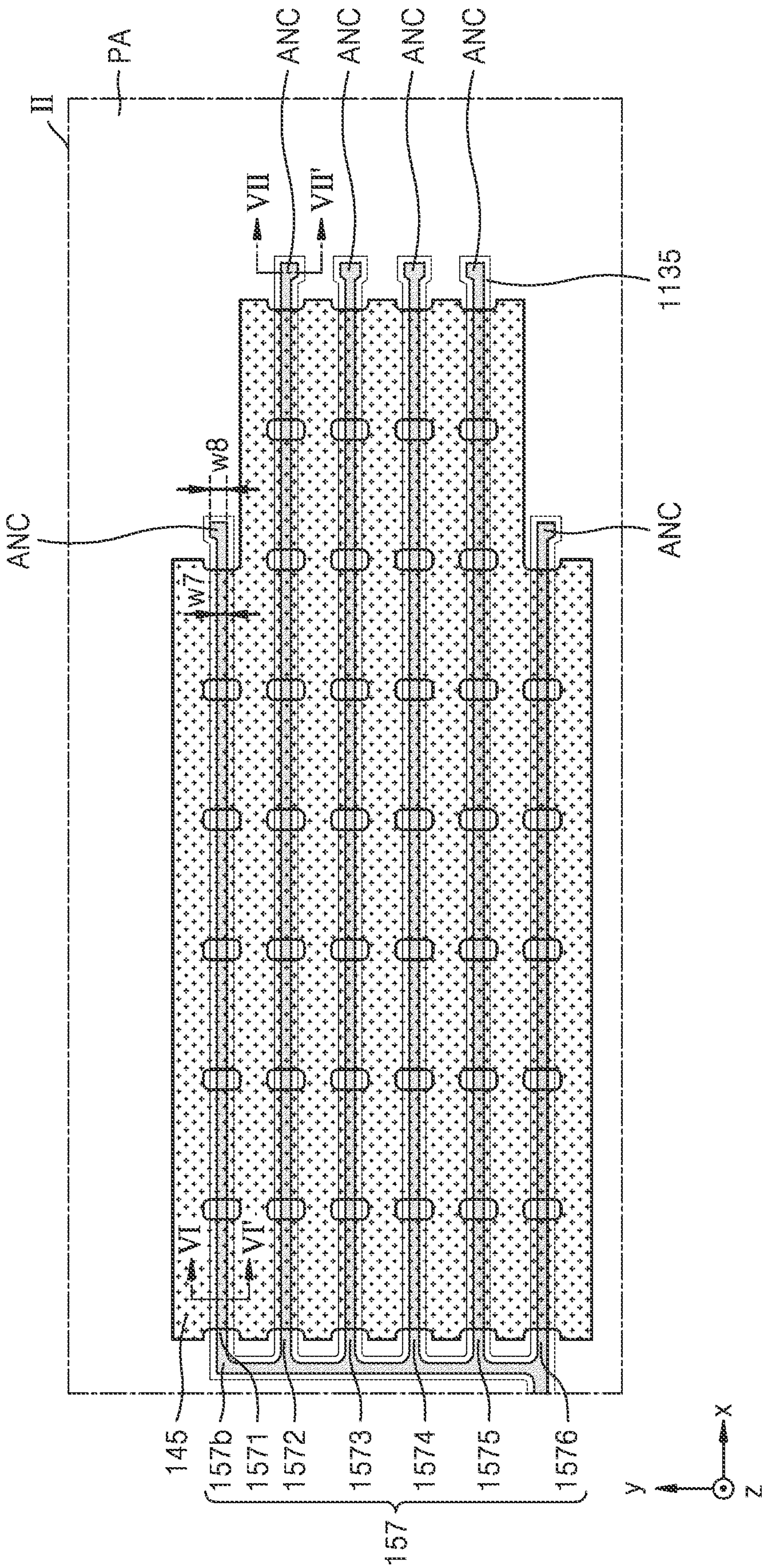
FIGS. 12A and 12B are schematic plan views of a portion of a display apparatus according to embodiments.
Figure 12B:
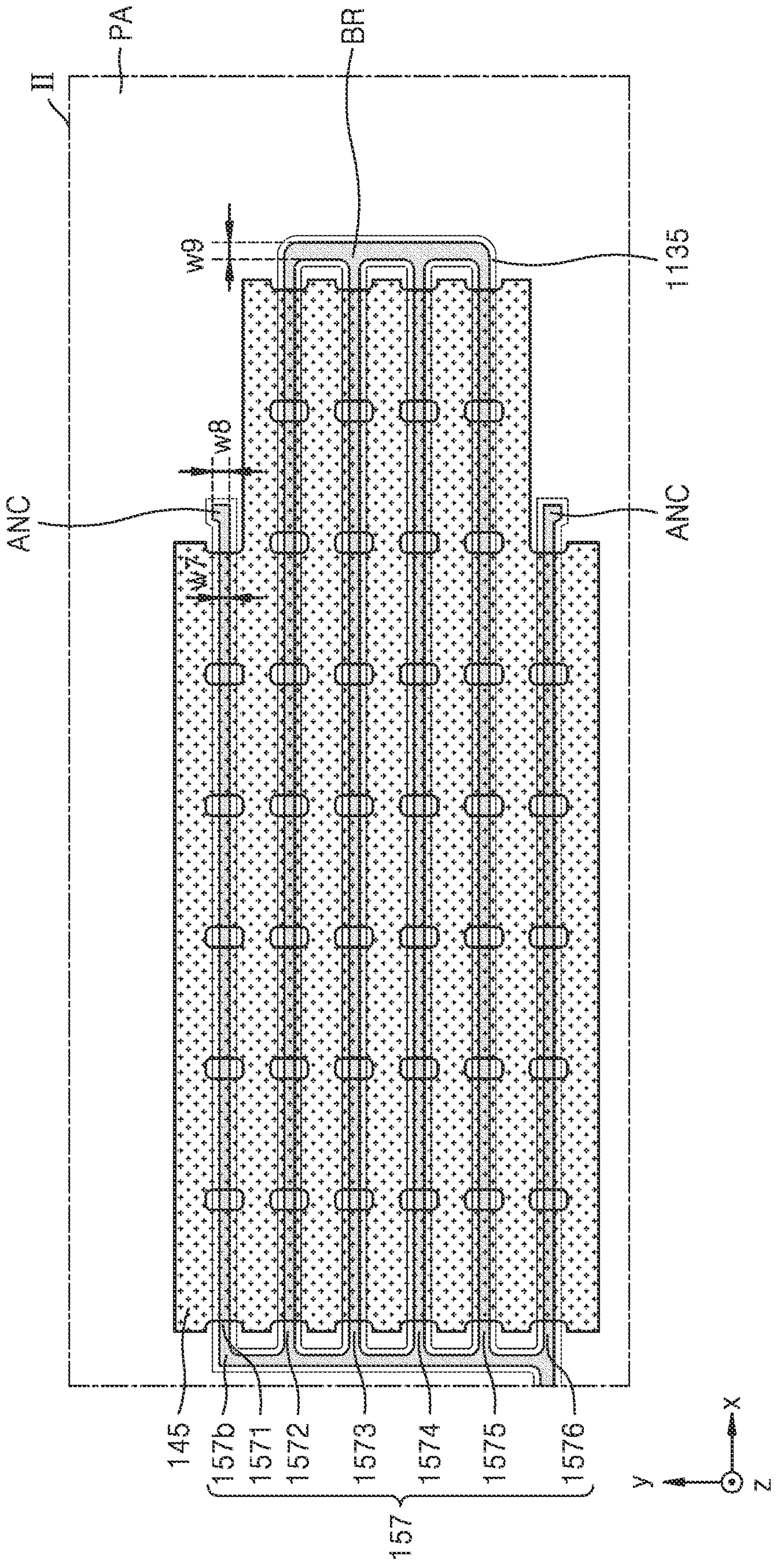

FIG. 11 is a schematic plan view of a portion of a display apparatus according to an embodiment, and FIGS. 12A and 12B are schematic plan views of a portion of a display apparatus according to embodiments. FIG. 11 may be a plan view schematically illustrating the region II of the display apparatus 1 illustrated in FIG. 1. FIGS. 12A and 12B illustrate a third semiconductor pattern 145, a driving gate line 157, and the anchor ANC, which are arranged in the region II of the display apparatus 1 illustrated in FIG. 1.

Referring to FIG. 11, the display apparatus 1 according to an embodiment (see FIG. 1) may include the gate driver 12 located in the peripheral area PA (see FIG. 1). The gate driver 12 may be mounted in the form of an OSG.

The gate driver 12 may include the third semiconductor pattern 145, the driving gate line 157, and a plurality of first to sixth driving signal lines 311 to 316. The gate driver 12 may include a plurality of transistors TR arranged along the driving gate line 157.

The third semiconductor pattern 145 may include an oxide semiconductor material. For example, the third semiconductor pattern 145 may include an oxide of at least one material selected from among In, Ga, Sn, Zr, V, Hf, Cd, Ge, Cr, Ti, Al, Cs, Ce and Zn. The third semiconductor pattern 145 may include an ITZO (InSnZnO) semiconductor layer, an IGZO (InGaZnO) semiconductor layer, and the like. In an embodiment, the third semiconductor pattern 145 may be disposed on the same layer as the semiconductor layer 140 (see FIG. 5) of the display area DA (see FIG. 5).

The driving gate line 157 may be disposed on the third semiconductor pattern 145. The driving gate line 157 may include a conductive material including Mo, Al, Cu, Ti, and the like. The driving gate line 157 may be formed in a multilayer or single layer structure including the conductive materials described above. For example, the driving gate line 157 may have a multilayer structure of Ti/Al/Ti. Alternatively, the driving gate line 157 may have a multilayer structure of Ti/Cu/Ti/Cu. The driving gate line 157 may be disposed on the same layer as the second conductive layer 150 (see FIG. 5) of the display area DA (see FIG. 5).

As illustrated in FIGS. 12A and 12B, the driving gate line 157 may include a body wire 157*b* extending in the first direction (e.g., the y direction), and a plurality of first to sixth branch wires 1571 to 1576 extending from the body wire 157*b* in the second direction (e.g., the x direction). The body wire 157*b* and the first to sixth branch wires 1571 to 1576 may be integrally provided.

The first to sixth branch wires 1571 to 1576 may not all have the same length. For example, among the first to sixth branch wires 1571 to 1576, the first branch wire 1571 and the sixth branch wire 1576 located outside may have lengths shorter than the second branch wire 1572, the third branch wire 1573, the fourth branch wire 1574, and the fifth branch wire 1575.

The anchor ANC may be located at one end portion (in the +x direction) of each of the first to sixth branch wires 1571 to 1576. Each anchor ANC may have a width in the first direction (e.g., the y direction) that is greater than the width of a corresponding branch wire in the first direction (e.g., the y direction). For example, the first branch wire 1571 may have a seventh width w7 in the first direction (e.g., the y direction), and the anchor ANC located at one end portion (in the +x direction) of the first branch wire 1571 may have an eighth width w8 that is greater than the seventh width w7 in the first direction (e.g., the y direction). The seventh width w7 may be about 2 μm or less, and the eighth width w8 may be greater than about 2 μm. Each anchor ANC may be integrally provided with a corresponding branch wire.

Referring to FIG. 12B, among the first to sixth branch wires 1571 to 1576, some adjacent branch wires (1572 to 1575) may be connected to a bridge wire BR extending in the first direction (e.g., the y direction). For example, one end portion (in the +x direction) of each of the second branch wire 1572, the third branch wire 1573, the fourth branch wire 1574, and the fifth branch wire 1575 may be connected to the bridge wire BR. The second branch wire 1572, the third branch wire 1573, the fourth branch wire 1574, and the fifth branch wire 1575 may be integrally provided with the bridge wire BR.

The bridge wire BR may have a ninth width w9 that is greater than the seventh width w7 in the second direction (e.g., the x direction). The ninth width w9 may be greater than about 2 μm. As the ninth width w9 of the bridge wire BR in the second direction (e.g., the x direction) is greater than about 2 μm, even when the bridge wire BR is partially eroded in the wet etching process for forming the driving gate line 157, a sufficient attachment surface may be provided to the photoresist pattern. Accordingly, the display apparatus 1 according to an embodiment may prevent loss of a portion of the photoresist pattern used as a mask in the dry etching process for forming a third insulating pattern 1135, thereby reducing a difference in the electrical characteristics between the transistors TR.

The third insulating pattern 1135 may be disposed below the driving gate line 157, the anchors ANC, and the bridge wire BR. The third insulating pattern 1135 may include $SiO_2$, $SiN_x$, SiON, $Al_2O_3$, $TiO_2$, $Ta_2O_5$, $HfO_2$, $ZnO_2$, or the like. The third insulating pattern 1135 may be disposed on the same layer as the gate insulating layer 113 of the display area DA (see FIG. 5).

The third insulating pattern 1135 may be arranged between the driving gate line 157 and the third semiconductor pattern 145. The third insulating pattern 1135 may have a shape matching the shapes of the driving gate line 157, the anchors ANC, and the bridge wire BR.

The width of the third insulating pattern 1135 may be greater than the widths of the driving gate line 157, the anchors ANC, and the bridge wire BR. Accordingly, the third insulating pattern 1135 may have a shoulder portion extending beyond the edges of the driving gate line 157, the anchors ANC, and the bridge wire BR.

The first to sixth driving signal lines 311 to 316 may be arranged with the driving gate line 157 therebetween. The first to sixth driving signal lines 311 to 316 may include a (semi-)light-transmissive electrode layer or a reflective electrode layer. The first to sixth driving signal lines 311 to 316 may include a reflective layer including Ag, Mg, Al, Pt, Pd, Au, Ni, Nd, Ir, Cr, a compound thereof, and the like, and a transparent or translucent electrode layer formed on the reflective layer. The transparent or translucent electrode layer may include at least one material selected from among ITO, IZO, ZnO, In2O3, IGO, and AZO. The first to sixth driving signal lines 311 to 316 may be arranged on the same layer as the third conductive layer 210 (see FIG. 5) of the display area DA (see FIG. 5).

The first to sixth driving signal lines 311 to 316 may be electrically connected to the third semiconductor pattern 145 through a plurality of contact holes. The first to sixth driving signal lines 311 to 316 may be arranged parallel to each other with the first to sixth branch wires 1571 to 1576 of the driving gate line 157 therebetween. Any one of two driving signal lines neighboring each other with each of the first to sixth branch wires 1571 to 1576 of the driving gate line 157 therebetween may function as a source electrode, and the other may function as a drain electrode.

For example, the first driving signal line 311 and the second driving signal line 312 may be arranged parallel to each other with the first branch wire 1571 therebetween. The second driving signal line 312 and the first driving signal line 311 may be arranged parallel to each other with the second branch wire 1572 therebetween. Any one of the first driving signal line 311 and the second driving signal line 312 may function as a source electrode of the transistors TR overlapping the first branch wire 1571 and the second branch wire 1572, and the other may function as a drain electrode of the transistors TR.

Likewise, the third driving signal line 313 may be arranged between the third branch wire 1573 and the fourth branch wire 1574, the fourth driving signal line 314 may be arranged between the fourth branch wire 1574 and the fifth branch wire 1575, the fifth driving signal line 315 may be arranged between the fifth branch wire 1575 and the sixth branch wire 1576, and the sixth driving signal line 316 may be arranged apart from the sixth branch wire 1576. The fourth driving signal line 314 may be electrically connected to and the sixth driving signal line 316 through a connection wire CL. The third driving signal line 313, the fourth driving signal line 314, the fifth driving signal line 315, and the sixth driving signal line 316 may each function as a source electrode or a drain electrode of the corresponding transistor TR.

Figure 13A:
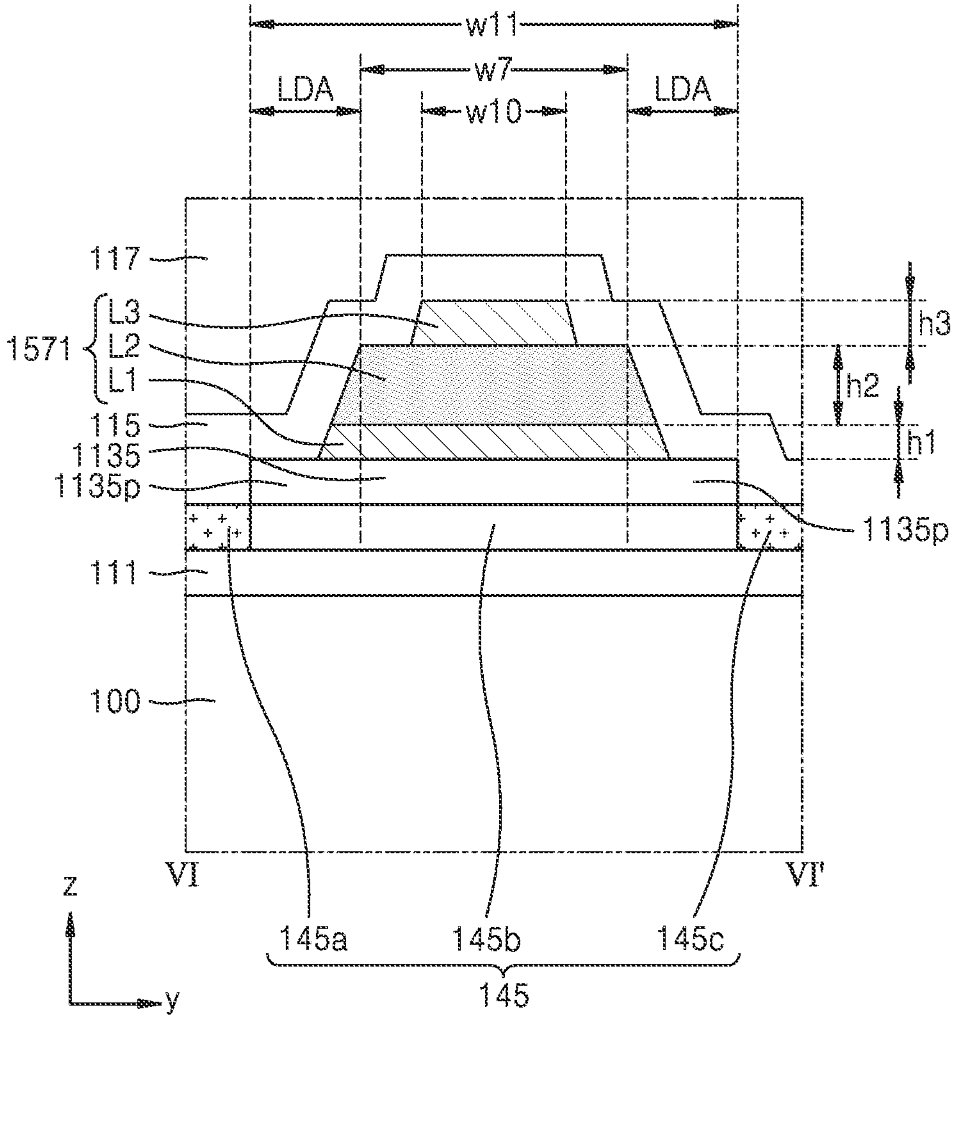
FIGS. 13A and 13B are schematic cross-sectional views of a portion of a display apparatus according to embodiments.
Figure 13B:
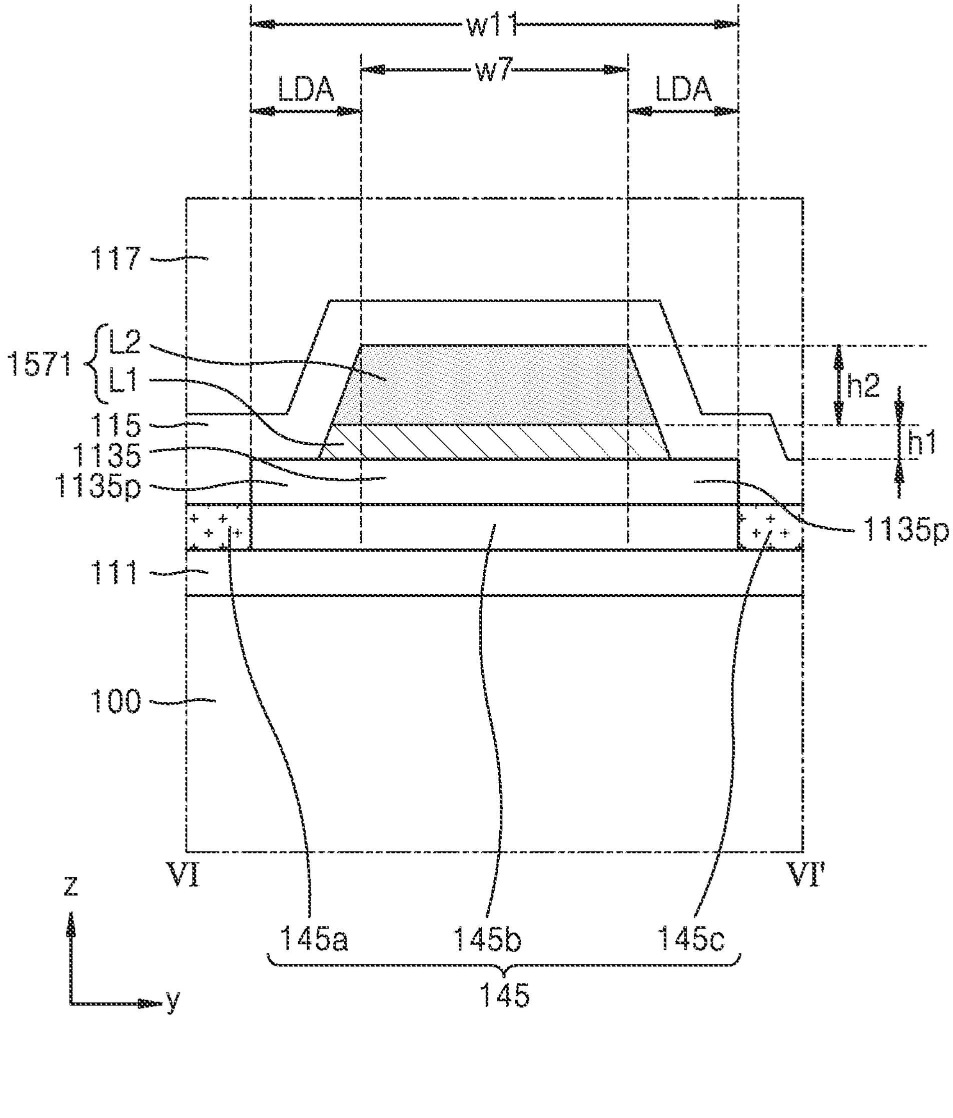
Figure 14:
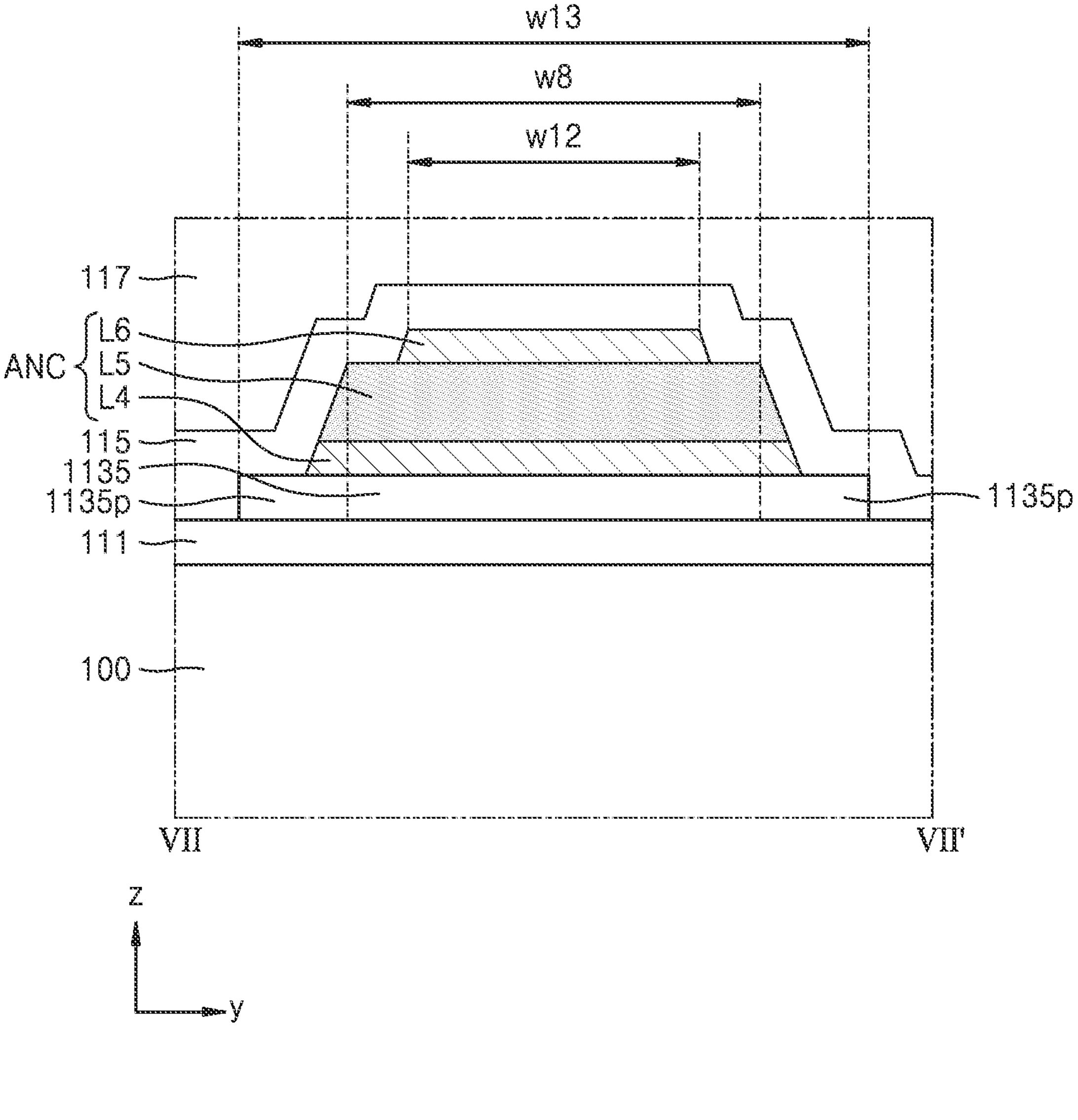
FIG. 14 is a schematic cross-sectional view of a portion of a display apparatus according to embodiments.

FIGS. 13A and 13B are schematic cross-sectional views of a portion of a display apparatus according to embodiments, and FIG. 14 is a schematic cross-sectional view of a portion of a display apparatus according to embodiments. FIGS. 13A and 13B may be cross-sectional views taken along line VI-VI' of the display apparatus illustrated in FIG. 12A, and FIG. 14 may be a cross-sectional view taken along line VII-VII' of the display apparatus illustrated in FIG. 12A.

Referring to FIG. 13A, the buffer layer 111 may be disposed on the substrate 100. The buffer layer 111 may reduce or prevent infiltration of foreign materials, such as moisture or external air, from under the substrate 100. The buffer layer 111 may include an inorganic material, such as an oxide or a nitride, an organic material, or an organic/inorganic complex. The buffer layer 111 may have a single layer or multilayer structure.

The third semiconductor pattern 145 may be disposed on the buffer layer 111. The third semiconductor pattern 145 may include an oxide semiconductor material. For example, the third semiconductor pattern 145 may include an oxide of at least one material selected from among In, Ga, Sn, Zr, V, Hf, Cd, Ge, Cr, Ti, Al, Cs, Ce and Zn.

The third semiconductor pattern 145 may include a third-1 conductive region 145*a*, a third semiconductor region 145*b*, and a third-2 conductive region 145*c*. The third semiconductor region 145*b* may be arranged between a third-1 conductive region 145*a* and the third-2 conductive region 145*c*.

The first branch wire 1571 may be disposed on the third semiconductor pattern 145. The first branch wire 1571 may have a multilayer structure including the first metal layer L1, the second metal layer L2, and the third metal layer L3, which are sequentially stacked on each other. The first metal layer L1 may include a first metal material, and the second metal layer L2 may include a second metal material different from the first metal material. For example, the first metal layer L1 may include Ti, and the second metal layer L2 may include Cu. The third metal layer L3 may function as a capping layer to secure stability of patterning in the wet etching process. The third metal layer L3 may have a double layer structure of Ti/Cu. Alternatively, the third metal layer L3 may include an ITO layer.

The first branch wire 1571 may have a sufficient height in the third direction (e.g., the z direction) to have low resistance. For example, the second metal layer L2 may have the second height h2 of about 6 kÅ to about 11 kÅ. The first metal layer L1 may have the height h1 of about 200 Å. In order to prevent overetching of the upper portion of the second metal layer L2 as the height of the second metal layer L2 increases, the third metal layer L3 functioning as a capping layer may be formed. When the third metal layer L3 has a double layer structure of Ti/Cu, the third metal layer L3 may have the third height h3 of about 550 Å.

The first branch wire 1571 may have the seventh width w7 in the first direction (e.g., the y direction). The second metal layer L2 may have the cross-section of a trapezoidal shape in which the width of an upper surface is less than the width of a lower surface. The seventh width w7 of first branch wire 1571 in the first direction (e.g., the y direction) may be defined based on the width of the upper surface of the second metal layer L2. The seventh width w7 may be about 2 μm or less.

As the third metal layer L3 is eroded in the wet etching process to pattern the first branch wire 1571, the third metal layer L3 may have a tenth width w10 that is less than the seventh width w7, in the first direction (e.g., the y direction). In a plan view, the third metal layer L3 may be located inside the upper surface of the second metal layer L2.

In an embodiment, as illustrated in FIG. 13B, the first branch wire 1571 may include the first metal layer L1 and the second metal layer L2 only. As the second metal layer L2 has the second height h2 of about 6 kÅ to about 11 kÅ, in the wet etching process of the first branch wire 1571, the third metal layer L3 may be eroded by about 0.8 μm to 1.0 μm inwardly from the boundary of the upper surface of the second metal layer L2. Accordingly, when the seventh width w7 of the first branch wire 1571 in the first direction (e.g., the y direction) is about 2 μm or less, the third metal layer L3 on the second metal layer L2 may be completely removed.

As described with reference to FIGS. 12A and 12B, the third insulating pattern 1135 may have a shape that matches the shape of the driving gate line 157. When the first branch wire 1571 has the seventh width w7 in the first direction (e.g., the y direction), the third insulating pattern 1135 may have an eleventh width w11 that is greater than the seventh width w7 in the first direction (e.g., the y direction). In other words, the third insulating pattern 1135 may include a shoulder portion **1135*p* extending to the outside of the first branch wire 1571. In a plan view, the first branch wire 1571 may be located inside the third insulating pattern 1135**.

The third semiconductor region **145*b* of the third semiconductor pattern 145 may overlap the third insulating pattern 1135. The lightly doped area LDA may be provided in the third semiconductor region 145*b* overlapping the shoulder portion 1135*p* of the third insulating pattern 1135. The lightly doped area LDA may be an LDD area doped at a lower concentration than that of the third-1 conductive region 145*a* and the third-2 conductive region 145*c***.

Referring to FIG. 14, the third insulating pattern 1135 may be disposed on the buffer layer 111, and the anchor ANC may be disposed on the third insulating pattern 1135. In this disclosure, widths of the metal layers are measured based on the top surface (the short side of the trapezoidal cross section).

The anchor ANC may have a multilayer structure including the fourth metal layer L4, the fifth metal layer L5, and the sixth metal layer L6, which are sequentially stacked on each other. The fourth metal layer L4 may include a first metal material, and the fifth metal layer L5 may include a second metal material different from the first metal material. For example, the fourth metal layer L4 may include Ti, and the fifth metal layer L5 may include Cu. The sixth metal layer L6 may function as a capping layer to secure stability of patterning in the wet etching process. The sixth metal layer L6 may have a double layer structure of Ti/Cu. Alternatively, the sixth metal layer L6 may include an ITO layer.

The anchor ANC may be integrally provided with the first branch wire 1571. Accordingly, the fourth metal layer L4 may include the same material as the first metal layer L1, the fifth metal layer L5 may include the same material as the second metal layer L2, and the sixth metal layer L6 may include the same material as the third metal layer L3.

The anchor ANC may have the eighth width w8 in the first direction (e.g., the y direction). The eighth width w8 of anchor ANC in the first direction (e.g., the y direction) may be defined based on the width of the upper surface of the fifth metal layer L5. The eighth width w8 may be greater than the seventh width w7 of the first branch wire 1571. For example, the eighth width w8 may be greater than about 2 μm.

As the sixth metal layer L6 is eroded in the wet etching process to pattern the anchor ANC, the sixth metal layer L6 may have a twelfth width w12 that is less than the eighth width w8, in the first direction (e.g., the y direction). In a plan view, the sixth metal layer L6 may be located inside the upper surface of the fifth metal layer L5. As the eighth width w8 of anchor ANC in the first direction (e.g., the y direction) is greater than about 2 μm, even when the sixth metal layer L6 is partially eroded in the wet etching process, the sixth metal layer L6 may provide an attachment surface to which a photoresist pattern and the like is attached. A thirteenth width w13 of the third insulating pattern 1135 in the first direction (e.g., the y direction) may be greater than the eighth width w8. In other words, the third insulating pattern 1135 may include a shoulder portion **1135*p*** extending beyond the edge of the anchor ANC.

Figure 15:
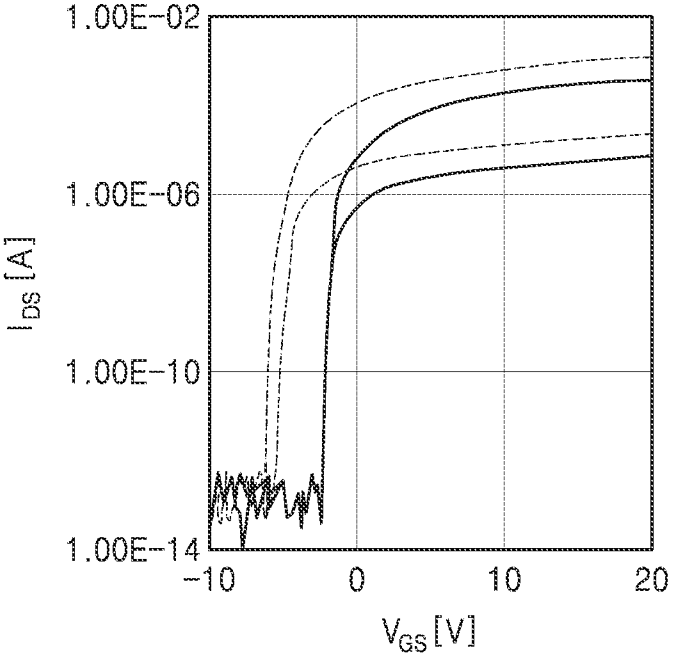
FIG. 15 is a graph showing a source-drain current change according to a gate-source voltage change of a display apparatus according to a comparative example.
Figure 16:
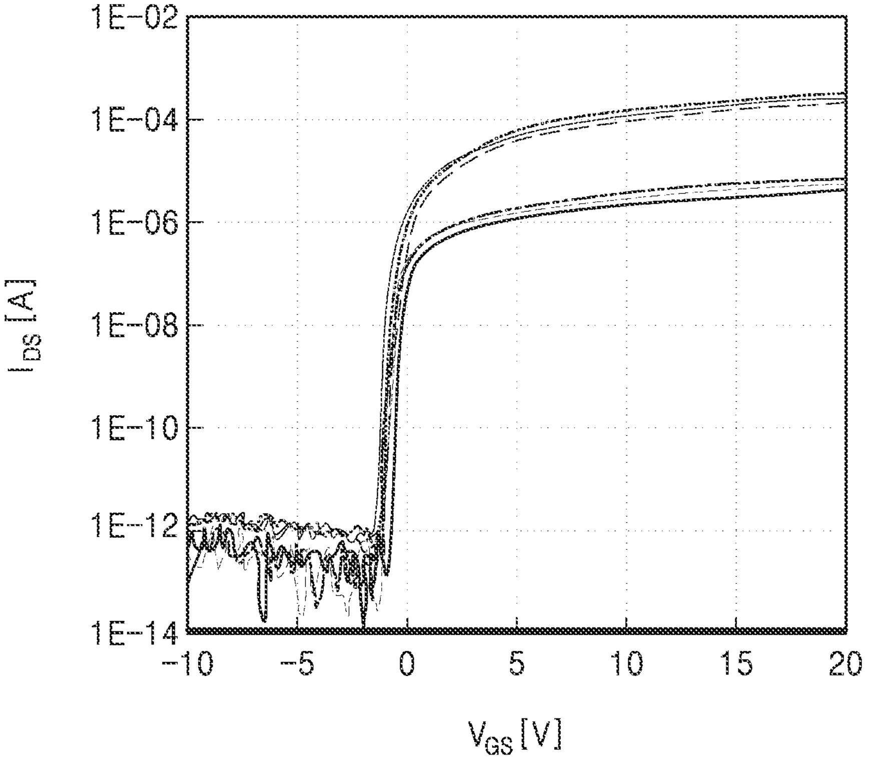
FIG. 16 is a graph showing a source-drain current change according to a gate-source voltage change of a display apparatus according to an embodiment.

FIG. 15 is a graph showing a source-drain current IDS change according to a gate-source voltage VGS change of a display apparatus according to a comparative example, and FIG. 16 is a graph showing a source-drain current IDS change according to a gate-source voltage VGS change of a display apparatus according to an embodiment.

A display apparatus according to a comparative example includes a gate line extending in one direction, wherein no anchor is formed at an end portion of the gate line, whereas a display apparatus according to an embodiment includes a gate line extending in one direction and further includes an anchor located at an end portion of the gate line, and the anchor has a width greater than the width of the gate line.

Referring to FIG. 15, in some of the gate lines of a display apparatus according to a comparative example, a photoresist pattern is lost after a wet etching process, and thus an insulating pattern formed below each of the gate lines does not have a shoulder portion. For a transistor in which an insulating pattern does not have a shoulder portion, the threshold voltage is moved in a negative direction due to the introduction of external hydrogen and the non-forming of an LDD. Accordingly, it may be confirmed that dispersion occurs in the electrical characteristics of transistors included in the display apparatus according to a comparative example.

Referring to FIG. 16, in the gate lines of a display apparatus according to an embodiment, as a photoresist pattern is attached on the anchor during the process and not lost, insulating patterns formed below the gate lines have a shoulder portion. Accordingly, it may be confirmed that the transistors included in the display apparatus according to an embodiment has substantially the same electrical characteristics.

According to the embodiment as described above, a display apparatus for displaying a high-quality image may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area and a peripheral area outside the display area, wherein a plurality of pixels are arranged in the display area;

a data line arranged in the display area and extending in a first direction;

a first semiconductor pattern disposed on the data line and extending in a second direction crossing the first direction;

a gate line disposed on the first semiconductor pattern and extending in the first direction to cross the first semiconductor pattern; and an anchor located at an end portion of the gate line and having a width greater than a width of the gate line.

2. The display apparatus of claim 1, wherein the anchor is integrally provided with the gate line.

3. The display apparatus of claim 1, wherein the gate line includes a first metal layer and a second metal layer sequentially stacked on each other, the anchor includes a fourth metal layer, a fifth metal layer, and a sixth metal layer sequentially stacked on each other, an upper surface of the second metal layer has a first width in the second direction, an upper surface of the fifth metal layer has a second width in the second direction, and the second width is greater than the first width.

4. The display apparatus of claim 3, wherein the gate line further includes a third metal layer disposed on the second metal layer, the third metal layer has a third width in the second direction, and the third width is less than the first width.

5. The display apparatus of claim 4, wherein the sixth metal layer has a fifth width in the second direction, and the fifth width is greater than the third width.

6. The display apparatus of claim 3, further comprising a first insulating layer disposed on the gate line, wherein the first insulating layer is in direct contact with an upper surface of the second metal layer.

7. The display apparatus of claim 3, further comprising a first insulating pattern arranged between the first semiconductor pattern and the gate line, wherein the first insulating pattern has a fourth width in the second direction, and the fourth width is greater than the first width.

8. The display apparatus of claim 7, wherein the first insulating pattern has a shape matching a shape of the gate line.

9. The display apparatus of claim 8, wherein the first insulating pattern has a shoulder portion extending beyond an edge of the gate line.

10. A display apparatus comprising:

a first data line and a second data line disposed apart from each other on a substrate and extending in a first direction;

a first-1 semiconductor pattern electrically connected to the first data line and extending in a second direction crossing the first direction;

a first-2 semiconductor pattern electrically connected to the second data line and extending in the second direction;

a first gate line extending in the first direction to cross the first-1 semiconductor pattern;

a second gate line extending in the first direction to cross the first-2 semiconductor pattern;

a first anchor arranged between the first gate line and the second gate line, extending in the first direction, and having a width greater than a width of the first gate line and a width of the second gate line; and a second anchor located at an end portion of the second gate line and having a width greater than the width of the first gate line and the width of the second gate line.

11. The display apparatus of claim 10, wherein the first gate line, the first anchor, the second gate line, and the second anchor are integrally provided.

12. The display apparatus of claim 10, wherein the first gate line, the first anchor, the second gate line, and the second anchor share an extension axis.

13. The display apparatus of claim 10, wherein the first gate line and the second gate line each includes a first metal layer and a second metal layer sequentially stacked on each other, the first anchor and the second anchor each include a fourth metal layer, a fifth metal layer, and a sixth metal layer sequentially stacked on each other, an upper surface of the second metal layer has a first width in the second direction, an upper surface of the fifth metal layer has a second width in the second direction, and the second width is greater than the first width.

14. The display apparatus of claim 13, wherein the first gate line and the second gate line each further includes a third metal layer disposed on the second metal layer, the third metal layer has a third width in the second direction, and the third width is less than the first width.

15. The display apparatus of claim 13, further comprising:

a first-1 insulating pattern arranged between the first gate line and the first-1 semiconductor pattern; and a first-2 insulating pattern arranged between the second gate line and the first-2 semiconductor pattern, wherein the first-1 insulating pattern and the first-2 insulating pattern each has a fourth width in the second direction, and the fourth width is greater than the first width.

16. The display apparatus of claim 15, wherein the first-1 insulating pattern has a shape that matches a shape of the first gate line and includes a shoulder portion extending beyond an edge of the first gate line, and the first-2 insulating pattern has a shape that matches a shape of the second gate line and includes a shoulder portion extending beyond an edge of the second gate line.

17. A display apparatus comprising:

a substrate including a display area and a peripheral area outside the display area, wherein a plurality of pixels are arranged in the display area;

a third semiconductor pattern arranged in the peripheral area;

a driving gate line disposed on the third semiconductor pattern and including a body wire extending in a first direction and a plurality of branch wires extending from the body wire in a second direction crossing the first direction; and an anchor located at an end portion of at least one of the plurality of branch wires, and having a width greater than a width of a corresponding one of the plurality of branch wire.

18. The display apparatus of claim 17, wherein the anchor is integrally provided with the corresponding one of the plurality of branch wires.

19. The display apparatus of claim 17, wherein the plurality of branch wires each include a first metal layer and a second metal layer sequentially stacked on each other, the anchor includes a fourth metal layer, a fifth metal layer, and a sixth metal layer sequentially stacked on each other, an upper surface of the second metal layer has a seventh width in the first direction, an upper surface of the fifth metal layer has an eighth width in the first direction, and the eighth width is greater than the seventh width.

20. The display apparatus of claim 17, wherein at least one of the plurality of branch wires are connected to a bridge wire extending in the first direction, and a width of the bridge wire in the second direction is greater than widths of the some branch wires in the first direction.

21. The display apparatus of claim 20, wherein the bridge wire is integrally provided with the at least one of the plurality of branch wires.

22. The display apparatus of claim 17, further comprising a third insulating pattern arranged between the third semiconductor pattern and the driving gate line, wherein the third insulating pattern has a shape that matches a shape of the driving gate line and includes a shoulder portion extending beyond an edge of the driving gate line.

* * * * *